(12) United States Patent
Kirihara et al.

(10) Patent No.: US 11,917,917 B2
(45) Date of Patent: Feb. 27, 2024

(54) THERMOELECTRIC CONVERSION ELEMENT

(71) Applicant: NEC Corporation, Tokyo (JP)

(72) Inventors: Akihiro Kirihara, Tokyo (JP); Yasutomo Omori, Tokyo (JP); Ryohto Sawada, Tokyo (JP); Masahiko Ishida, Tokyo (JP); Koichi Terashima, Tokyo (JP); Yuma Iwasaki, Tokyo (JP); Hiroko Someya, Tokyo (JP)

(73) Assignee: NEC CORPORATION, Tokyo (JP)

( * ) Notice: Subject to any disclaimer, the term of this patent is extended or adjusted under 35 U.S.C. 154(b) by 241 days.

(21) Appl. No.: 17/297,243

(22) PCT Filed: Dec. 13, 2019

(86) PCT No.: PCT/JP2019/048895
§ 371 (c)(1),
(2) Date: May 26, 2021

(87) PCT Pub. No.: WO2020/129835
PCT Pub. Date: Jun. 25, 2020

(65) Prior Publication Data
US 2022/0052247 A1    Feb. 17, 2022

(30) Foreign Application Priority Data

Dec. 20, 2018  (JP) .................................. 2018-238642
May 28, 2019  (JP) .................................. 2019-099484

(51) Int. Cl.
*C22C 38/06*  (2006.01)
*C22C 38/18*  (2006.01)
*H10N 15/20*  (2023.01)

(52) U.S. Cl.
CPC ............. *H10N 15/20* (2023.02); *C22C 38/06* (2013.01); *C22C 38/18* (2013.01); *C22C 2202/02* (2013.01)

(58) Field of Classification Search
CPC ..... C22C 2202/02; C22C 38/18; C22C 38/06; H02N 11/00; H10N 15/00; H10N 15/20
(Continued)

(56) References Cited

U.S. PATENT DOCUMENTS

| 6,841,011 B2* | 1/2005 | Lin ........................... F01D 5/28 148/333 |
| 9,128,142 B1* | 9/2015 | Qu ........................ H10N 52/01 |

(Continued)

FOREIGN PATENT DOCUMENTS

| JP | 2004-119647 A | 4/2004 |
| JP | 2004-253618 A | 9/2004 |

(Continued)

OTHER PUBLICATIONS

International Search Report for PCT Application No. PCT/JP2019/048895, dated Mar. 10, 2020.
(Continued)

*Primary Examiner* — Jie Yang
(74) *Attorney, Agent, or Firm* — Sughrue Mion, PLLC

(57) ABSTRACT

A thermoelectric conversion element that has a power generation layer containing an iron-aluminum based magnetic alloy material containing equal to or more than 70 weight percent of iron and aluminum in total. The power generation layer generates an electromotive force, due to an anomalous Nernst effect that develops in the magnetic alloy material in response to a temperature gradient applied thereto, in a direction intersecting both the magnetization direction of the magnetic alloy material and the direction of the applied temperature gradient.

10 Claims, 20 Drawing Sheets

(58) Field of Classification Search
USPC .......................................................... 420/62
See application file for complete search history.

(56) References Cited

U.S. PATENT DOCUMENTS

| | | | |
|---|---|---|---|
| 2011/0084349 | A1 | 4/2011 | Uchida et al. |
| 2013/0154633 | A1 | 6/2013 | Fujiwara et al. |
| 2015/0380630 | A1 | 12/2015 | Ishida et al. |
| 2018/0331273 | A1 | 11/2018 | Kirihara et al. |
| 2021/0066567 | A1* | 3/2021 | Omori ............... H01F 1/147 |

FOREIGN PATENT DOCUMENTS

| | | |
|---|---|---|
| JP | 2004-538359 A | 12/2004 |
| JP | 2008-021982 A | 1/2008 |
| JP | 2012-049403 A | 3/2012 |
| JP | 2016-009838 A | 1/2016 |
| WO | 2009/151000 A1 | 12/2009 |
| WO | 2017/082266 A1 | 5/2017 |

OTHER PUBLICATIONS

English translation of Written opinion for PCT Application No. PCT/JP2019/048895, dated Mar. 10, 2020.

Mizuguchi et al., "Anomalous Nernst Effect in an L10-Ordered Epitaxial FePt Thin Film", Applied Physics Express, vol. 5, No. 9. Sep. 2012, pp. 1-3.

Isogami et al., "Dependence of anomalous Nernst effect on crystal orientation in highly ordered γ-Fe4N films with anti-perovskite structure", Applied Physics Express, vol. 10, No. 7, Jul. 2017, pp. 1-4.

Chuang et al., "Enhancement of the anomalous Nernst effect in ferromagnetic thin films", Physical Review B, vol. 96, Issue 17, Nov. 2017, pp. 1-5.

Uchida et al., "Longitudinal spin-Seebeck effect in sintered polycrystalline (MnZn)Fe2O4", Applied Physics Letters, vol. 97, Issue 26, Dec. 17, 2010, pp. 1-3.

Miao et al., "Inverse Spin Hall Effect in a Ferromagnetic Metal", Physical Review Letters, vol. 111, Issue 06, Aug. 9, 2013, pp. 1-5.

JP Office Action for JP Application No. 2020-561376, dated Jun. 13, 2023 with English Translation.

* cited by examiner

THERMOELECTRIC CONVERSION ELEMENT

This application is a National Stage Entry of PCT/JP2019/048895 filed on Dec. 13, 2019, which claims priority from Japanese Patent Application 2018-238642 filed on Dec. 20, 2018 and Japanese Patent Application 2019-099484 filed on May 28, 2019, the contents of all of which are incorporated herein by reference, in their entirety.

TECHNICAL FIELD

The present invention relates to a thermoelectric conversion element containing a magnetic alloy material.

BACKGROUND ART

As one of the thermal management technologies for a sustainable society, the expectation for thermoelectric conversion is increasing. Heat is an energy source that can be recovered in a variety of situations including body temperature, solar heat, and industrial waste heat. Hence, in a wide range of uses such as improvement in efficiency of energy utilization, power supply to portable terminals, sensors, and the like, and visualization of heat flow by heat flow sensing, expectation for thermoelectric conversion is likely to increase even more.

PTLs 1 to 3 disclose a thermoelectric conversion element containing an iron-vanadium-aluminum (FeVAl) based compound having a Heusler structure. In the thermoelectric conversion element disclosed in PTLs 1 to 3, the Seebeck effect develops in which holes and electrons are transferred by applying a temperature difference between the two main surfaces and an electromotive force is generated between both terminals.

In recent years, a thermoelectric conversion element containing a magnetic material for converting an applied temperature gradient into a current has been developed. For such a thermoelectric conversion element, a magnetic material that exhibits the anomalous Nernst effect or the spin Seebeck effect by a temperature gradient is used.

The thermoelectric conversion element exhibiting the anomalous Nernst effect includes a magnetic metal magnetized in one direction. When a temperature gradient is applied to the magnetic material exhibiting the anomalous Nernst effect, a heat flow generated by the temperature gradient is converted into a current in the magnetic metal. Since a thermoelectric conversion element using the anomalous Nernst effect has a simpler element structure than an element using the Seebeck effect, the thermoelectric conversion element using the anomalous Nernst effect can be expected to be applied to a wide range of uses.

NPL 1 discloses an iron-platinum (FePt) alloy containing platinum having a large spin-orbit interaction as a magnetic material exhibiting the anomalous Nernst effect. NPL 2 discloses an iron nitride ($\gamma'$-Fe$_4$N) based material and an iron-aluminum (Fe$_{80}$Al$_{20}$) based alloy material as magnetic materials exhibiting the anomalous Nernst effect. The magnetic material disclosed in NPLs 1 and 2 is a thin-film element in which a thin film of a ferromagnetic material is formed on a non-magnetic substrate.

NPL 3 discloses that an electromotive force (output voltage) based on the anomalous Nernst effect shows film thickness dependence. The film thickness dependence of the electromotive force based on the anomalous Nernst effect suggests that the electromotive force may differ between a thin film system with a thickness of several tens to several hundred nanometers and a bulk system with a thickness equal to or more than 10 micrometers even when magnetic materials of the same composition are used. That is, a material having a large anomalous Nernst effect in a thin film system may exhibit a large anomalous Nernst effect even in a bulk system, and a material having a small anomalous Nernst effect in a thin film system may exhibit a large anomalous Nernst effect in a bulk system.

A thermoelectric conversion element using the spin Seebeck effect is configured by a two-layer structure of a magnetic insulator layer having magnetization in one direction and an electromotive body layer having conductivity. When a temperature gradient is applied in the out-of-plane direction of a thermoelectric conversion element using the spin Seebeck effect, a flow of spin angular momentum called spin current is induced in a magnetic insulator by the spin Seebeck effect. When the spin current induced in the magnetic insulator is injected into the electromotive body layer, a current flows in the in-plane direction in the electromotive film by the inverse spin Hall effect. Since a thermoelectric conversion element using the spin Seebeck effect is configured by using a magnetic insulator having a relatively small thermal conductivity, it is possible to maintain a temperature difference for performing effective thermoelectric conversion.

PTL 4 discloses a thermoelectric conversion element in which a single crystal yttrium gallium iron garnet (Hereinafter referred to as YIG) is used as a magnetic insulating layer and a platinum wire is used as an electromotive body layer. NPL 4 discloses a thermoelectric conversion element in which a polycrystalline Mn-Zn ferrite sintered body is used as a magnetic insulating layer and a platinum thin film is used as an electromotive body layer.

NPL 5 discloses a hybrid spin thermoelectric element using both the spin Seebeck effect and the anomalous Nernst effect. Since both the spin-Seebeck effect and the anomalous Nernst effect have the same symmetry of inducing an electromotive force in the in-plane direction by the temperature gradient in the out-of-plane direction, the thermoelectric conversion efficiency can be improved by combining the two effects. Since only permalloy, which is an alloy of nickel and iron, is disclosed in NPL 5, knowledge and guidelines for further improving thermoelectric conversion efficiency are required when designing a hybrid element that combines the spin Seebeck effect and the anomalous Nernst effect.

CITATION LIST

Patent Literature

[PTL 1] JP 2004-119647 A
[PTL 2] JP 2004-253618 A
[PTL 3] JP 2008-021982 A
[PTL 4] WO 2009/151000 A

Non Patent Literature

[NPL 1] M. Mizuguchi, S. Ohata, K. Uchida, E. Saitoh, K. Takanashi, "Anomalous Nernst Effect in an L 10-Ordered Epitaxial FePt Thin Film", Appl. Phys. Express 5 093002 (2012)
[NPL 2] S. Isogami, T. Takanashi, M. Mizuguchi, "Dependence of anomalous Nernst effect on crystal orientation in highly ordered $\gamma$-Fe4N films with anti-perovskite structure", Appl. Phys. Express 10, 073005 (2017)

[NPL 3] T. Chuang, P. Su, P. Wu, S. Huang, "Enhancement of the anomalous Nernst effect in ferromagnetic thin films", Phys. Rev B 96, 174406 (2017)
[NPL 4] K. Uchida, T. Nonaka, T. Ota, E. Saitoh, "Longitudinal spin-Seebeck effect in sintered polycrystalline (MnZn) $Fe_2O_4$", Appl. Phys. Lett. 97, 262504 (2010)
[NPL 5] B. Miao, S. Huang, D. QU, C. Chien, "Inverse Spin Hall Effect in a Ferromagnetic Metal", Phys. Rev. Lett. 111, 066602 (2013)

SUMMARY OF INVENTION

Technical Problem

It has been considered necessary to add noble metals such as platinum and gold and heavy elements such as rare earth elements with large spin-orbit interaction in order to exhibit a large anomalous Nernst effect. However, noble metals such as platinum and gold, and heavy elements such as rare earth elements are rare and expensive.

Platinum is added to the thermoelectric conversion element of NPL 1. Hence, the thermoelectric conversion element of NPL 1 has a problem that the material cost becomes high. A thermoelectric conversion element using the anomalous Nernst effect or the spin Seebeck effect has a lower thermoelectric conversion efficiency than a thermoelectric conversion element using the Seebeck effect, and therefore further improvement of the thermoelectric conversion efficiency is required for practical utilization.

Since the thermoelectric conversion element of NPL 2 is composed mainly of iron and aluminum, the material cost can be kept low. It is described that the thermoelectric conversion element of NPL 2 can achieve a relatively large anomalous Nernst effect when the atomic composition ratio of iron and aluminum is 8:2. However, due to the limitation of the number of samples measured, the composition that maximizes the anomalous Nernst effect is not disclosed. Hence, it is necessary to clarify the composition that maximizes the anomalous Nernst effect.

The thermoelectric conversion element disclosed in NPLs 1 and 2 is a thin-film element in which the film thickness of the ferromagnetic film exhibiting the anomalous Nernst effect is equal to or less than about 100 nanometers. In the case of a thin-film element, since the ferromagnetic film serving as the power generation layer is thin, when a temperature gradient in the out-of-plane direction perpendicular to the film surface is used, the effective temperature difference applied to the film becomes small, and it is difficult to improve the thermoelectric conversion efficiency. In order to perform thermoelectric conversion by effectively maintaining the temperature difference in the ferromagnetic layer, it is desirable to use a bulk element whose thickness of the ferromagnetic layer is equal to or more than 10 micrometers. However, as shown in NPL 3, there is a possibility that the anomalous Nernst effect may differ significantly between the thin-film element and the bulk element even if the same material is used. Hence, a bulk element capable of effectively maintaining the temperature difference, having a large anomalous Nernst effect, and a reduced material cost is required.

To solve the above problem, an object of the present invention is to provide a thermoelectric conversion element having a power generation layer having a large anomalous Nernst effect and a reduced material cost.

Solution to Problem

A thermoelectric conversion element of one aspect of the present invention exhibits the anomalous Nernst effect and contains an iron-aluminum alloy containing equal to or more than 70 wt % of iron and aluminum in total.

A thermoelectric conversion element of one aspect of the present invention has a power generation layer containing an iron-aluminum based magnetic alloy material containing equal to or more than 70 wt % of iron and aluminum in total. The power generation layer generates an electromotive force, due to an anomalous Nernst effect that develops in the magnetic alloy material in response to a temperature gradient applied thereto, in a direction intersecting both the magnetization direction of the magnetic alloy material and the direction of the applied temperature gradient.

Advantageous Effects of Invention

According to the present invention, it is possible to provide a thermoelectric conversion element having a power generation layer having a large anomalous Nernst effect and a reduced material cost.

EXAMPLE EMBODIMENT

Figure 1:
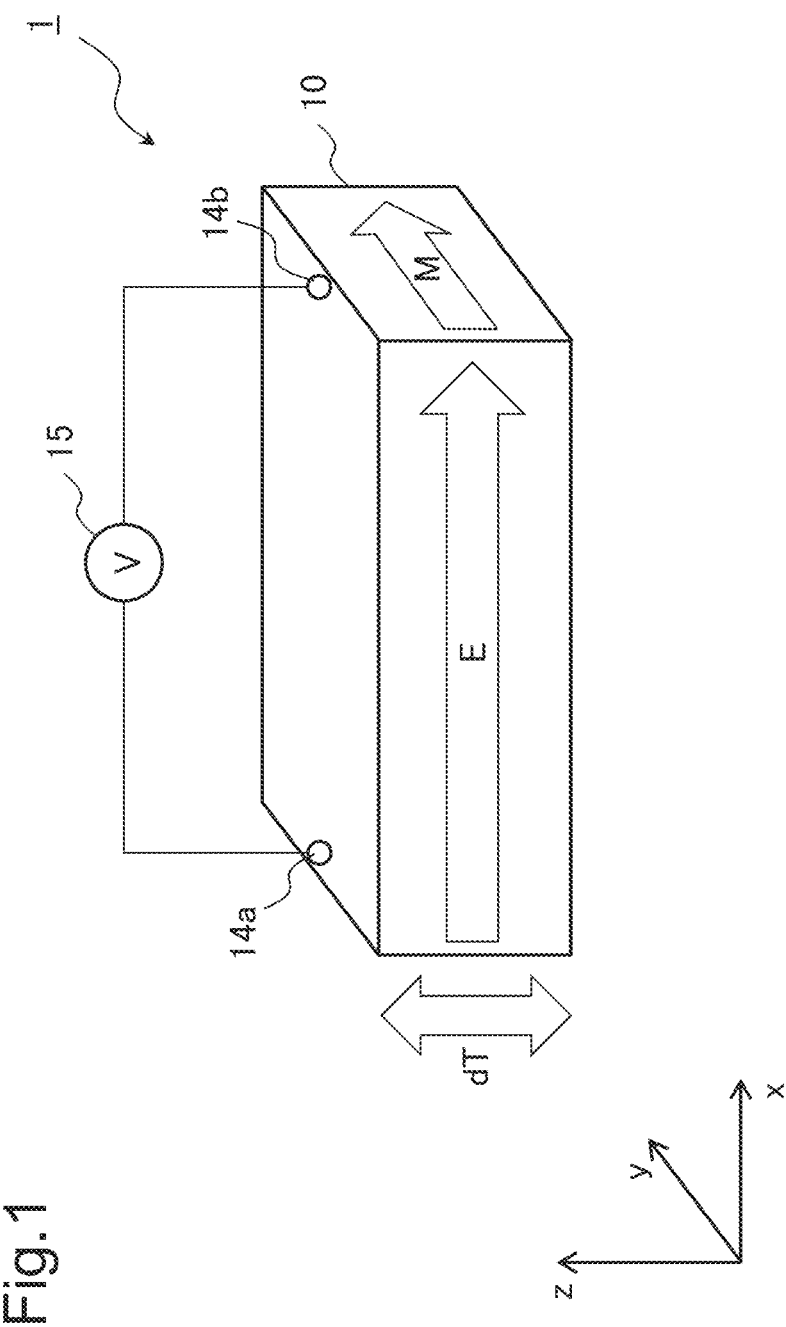
FIG. 1 is a conceptual diagram showing an example of a thermoelectric conversion element according to a first example embodiment of the present invention.

Hereinafter, embodiments of the present invention will be described with reference to the drawings. Note, however, that while the following example embodiments are technically preferable for carrying out the present invention, the scope of the invention is not limited to the following. In all the drawings used in the description of the following example embodiments, the same reference numerals are used for the same parts unless there is some particular reason. In the following example embodiments, description of the same configuration or operation may be omitted.

The following example embodiments show a thermoelectric conversion element using an iron-aluminum based (FeAl based) bulk alloy material composed mainly of iron (Fe) and aluminum (Al) as a power generation layer. The FeAl based alloy material shown in the following example embodiments achieves a higher thermoelectric conversion efficiency than an iron-platinum based (FePt based) bulk alloy material containing platinum (Pt), a cobalt-platinum based (CoPt based) bulk alloy material, or the like. Note that the term "bulk" used in the following example embodiments refers to a material that, unlike a thin film, has such a thickness that it can stand on its own even without a substrate. Typically, a material whose thickness is equal to or more than 10 micrometers (μm) is referred to as bulk.

First Example Embodiment

First, a thermoelectric conversion element according to a first example embodiment of the present invention will be described with reference to the drawings. The thermoelectric conversion element of the present example embodiment has a power generation layer that contains an iron-aluminum alloy (FeAl alloy) composed mainly of iron (Fe) and aluminum (Al).

FIG. 1 is a conceptual diagram showing an example of a thermoelectric conversion element 1 of the present example embodiment. The thermoelectric conversion element 1 has a power generation layer 10 containing an FeAl alloy. In FIG. 1, an electrode terminal 14a and an electrode terminal 14b are provided on one main surface of the power generation layer 10, and a voltmeter 15 for measuring a voltage between the electrode terminal 14a and the electrode terminal 14b is shown. Hereinafter, the in-plane direction indicates a direction parallel to the main surface of the power generation layer 10, and the out-of-plane direction indicates a direction perpendicular to the main surface of the power generation layer 10.

The thermoelectric conversion element 1 has the power generation layer 10 containing an FeAl alloy composed mainly of Fe and Al. The FeAl alloy is a ferromagnetic material, and has magnetization M in the in-plane direction (direction y in FIG. 1).

When a temperature gradient dT is applied in the out-of-plane direction (direction z in FIG. 1) of the power generation layer 10, due to the anomalous Nernst effect, an electromotive force E is generated in the in-plane direction (direction x in FIG. 1) perpendicular to the directions of both the magnetization M and the temperature gradient dT. By taking out the electromotive force E in the in-plane direction (direction x in FIG. 1) perpendicular to the directions of both the magnetization M and the temperature gradient dT as electricity from between the electrode terminal 14a and the electrode terminal 14b, thermoelectric conversion can be performed.

The power generation layer 10 contains an FeAl alloy containing equal to or more than 70 weight percent (wt %) of Fe and Al. The amount of Al added to Fe is preferably in the range of about 10 wt % to 17 wt %. In other words, the amount of Al added to Fe is preferably in the range of 20 atomic percent (at %) to 30 at %. Further, the atomic ratio of Fe to Al is more preferably 3:1 (85.7:14.3 by weight) $Fe_3Al$. $Fe_3Al$ is an ordered alloy with a face-centered cubic (fcc) lattice structure. The FeAl alloy of the power generation layer 10 may contain impurities other than Fe and Al for equal to or less than 20 mole percent (mol %), as long as the composition of Fe and Al is within the above-described range.

In order to maintain a sufficient temperature gradient dT, the film thickness of the power generation layer 10 is preferably equal to or more than a predetermined value. For example, the film thickness of the power generation layer 10 is preferably at least equal to or more than one micrometer (μm). For example, the film thickness of the power generation layer 10 is more preferably a bulk material equal to or more than 10 μm. For example, the film thickness of the power generation layer 10 is more preferably a bulk material equal to or more than one millimeter (mm).

As described above, the thermoelectric conversion element of the present example embodiment exhibits the anomalous Nernst effect and contains an iron-aluminum alloy containing equal to or more than 70 wt % of iron and aluminum in total.

The thermoelectric conversion element of one aspect of the present example embodiment has a power generation layer containing an iron-aluminum based magnetic alloy material containing equal to or more than 70 wt % of iron and aluminum in total. The power generation layer generates an electromotive force, due to an anomalous Nernst effect that develops in the magnetic alloy material in response to a temperature gradient applied thereto, in a direction intersecting both the magnetization direction of the magnetic alloy material and the direction of the applied temperature gradient. When a temperature gradient is applied, the power generation layer generates an electromotive force in a direction theoretically almost perpendicular to both the magnetization direction of the magnetic alloy material and the direction of the applied temperature gradient.

In one aspect of the present example embodiment, the power generation layer has a plate-like shape including two main surfaces facing each other, and the magnetic alloy material is magnetized in the in-plane direction of the main surface. When a temperature gradient is applied in the out-of-plane direction of the main surface, the power generation layer generates an electromotive force in a direction intersecting both the magnetization direction of the magnetic alloy material and the direction of the applied temperature gradient. When a temperature gradient is applied in the out-of-plane direction of the main surface, the power generation layer generates an electromotive force in a direction theoretically almost perpendicular to both the magnetization direction of the magnetic alloy material and the direction of the applied temperature gradient.

For example, the thickness of the power generation layer is preferably equal to or more than 1 μm. For example, the content of aluminum to iron in the magnetic alloy material is preferably in the range of 10 wt % to 17 wt %. For example, the composition ratio of iron to aluminum in the magnetic alloy material is preferably 3:1, and the magnetic alloy material is preferably an ordered alloy.

The thermoelectric conversion element of the present example embodiment has a power generation layer containing an FeAl alloy having a higher thermoelectric conversion efficiency than an iron-platinum alloy (FePt alloy) or a cobalt-platinum alloy (CoPt alloy). According to the FeAl alloy contained in the power generation layer of the thermoelectric conversion element of the present example embodiment, an electromotive force several times larger than that of an FePt alloy or a CoPt alloy can be obtained. The FeAl alloy contained in the power generation layer of the thermoelectric conversion element of the present example embodiment is inexpensive because it is composed mainly of Fe and Al which are cheaper than noble metals such as platinum (Pt) and iridium (Ir).

That is, according to the present example embodiment, it is possible to provide a thermoelectric conversion element having a power generation layer having a large anomalous Nernst effect and a reduced material cost.

Second Example Embodiment

Next, a thermoelectric conversion element according to a second example embodiment of the present invention will be described with reference to the drawings. The thermoelectric conversion element of the present example embodiment has a power generation layer containing an iron-aluminum-chromium alloy (FeAlCr alloy).

Figure 2:
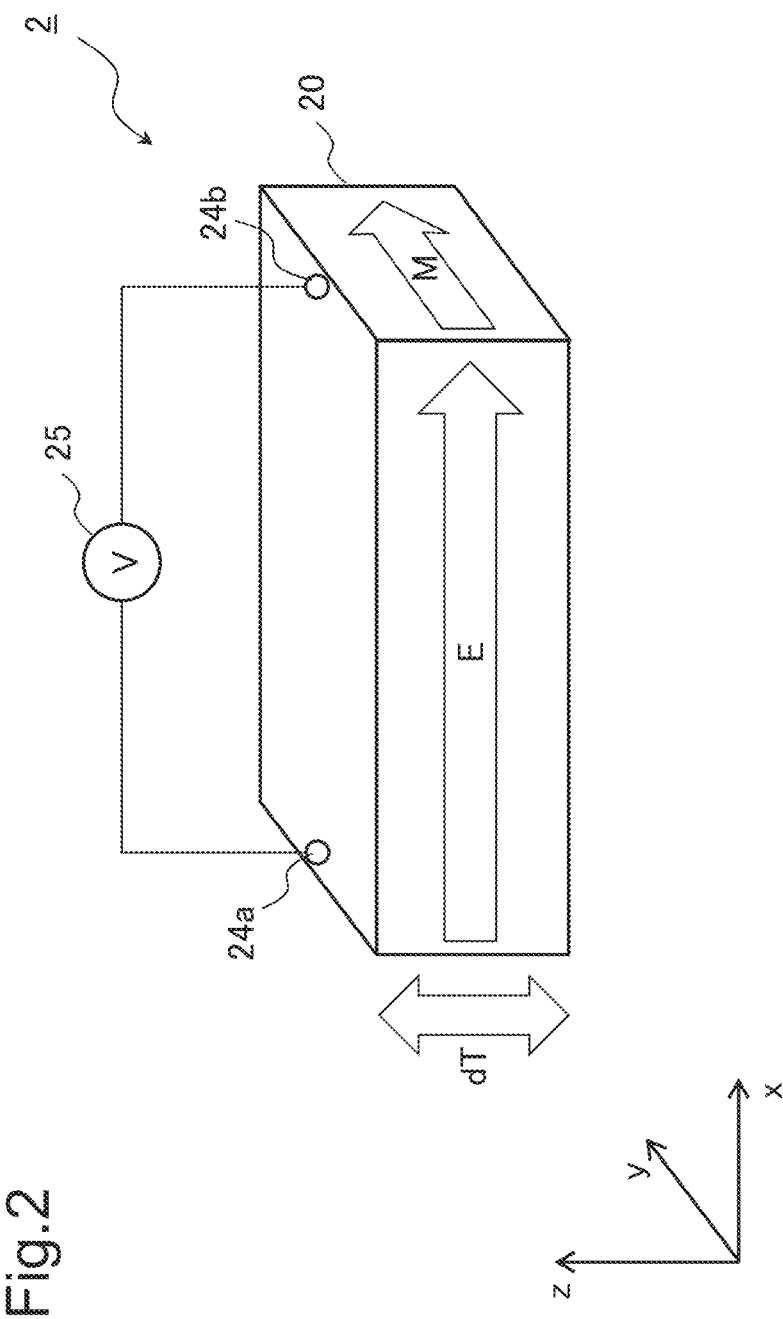
FIG. 2 is a conceptual diagram showing an example of a thermoelectric conversion element according to a second example embodiment of the present invention.

FIG. 2 is a conceptual diagram showing an example of a thermoelectric conversion element 2 of the present example embodiment. The thermoelectric conversion element 2 has a power generation layer 20 containing an FeAlCr alloy. In FIG. 2, an electrode terminal 24a and an electrode terminal 24b are provided on one main surface of the power generation layer 20, and a voltmeter 25 for measuring a voltage between the electrode terminal 24a and the electrode terminal 24b is shown.

The power generation layer 20 is a power generation layer of an FeAl-based magnetic alloy material containing equal to or more than 70 wt % of Fe and Al in total. The power generation layer 20 includes an FeAlCr alloy composed mainly of Fe, Al, and Cr. The FeAlCr alloy is a ferromagnetic material, and has magnetization M in the in-plane direction (direction y in FIG. 2).

When a temperature gradient dT is applied in the out-of-plane direction (direction z in FIG. 2) of the power generation layer 20, due to the anomalous Nernst effect, an electromotive force E is generated in the in-plane direction (direction x in FIG. 2) perpendicular to the direction of both the magnetization M and the temperature gradient dT. By taking out the electromotive force E in the in-plane direction (direction x in FIG. 2) perpendicular to the directions of both the magnetization M and the temperature gradient dT as electricity from between the electrode terminal 24a and the electrode terminal 24b, thermoelectric conversion can be performed.

The FeAlCr alloy of the power generation layer 20 contains equal to or more than 10 wt % and equal to or less than 25 wt % of Cr. The amount of Al added to Fe is preferably in the range of about 10 wt % (20 mol %) to 17 wt % (30 mol %). In other words, the amount of Al added to Fe is preferably in the range of 20 at % to 17 at %. Further, the atomic ratio of Fe to Al is more preferably 3:1 (85.7:14.3 by weight). The FeAlCr alloy of the power generation layer 20 may contain impurities other than Fe, Al, and Cr for equal to or less than 10 mol %, as long as the composition of Fe, Al, and Cr is within the above-described range.

In order to maintain a sufficient temperature gradient dT, the film thickness of the power generation layer 20 is preferably equal to or more than a predetermined value. For example, the film thickness of the power generation layer 20 is preferably at least equal to or more than 1 μm. For example, the film thickness of the power generation layer 20 is more preferably a bulk material equal to or more than 10 μm. For example, the film thickness of the power generation layer 20 is more preferably a bulk material equal to or more than 1 mm.

As described above, the thermoelectric conversion element of the present example embodiment includes an FeAlCr alloy having high thermoelectric conversion efficiency as a power generation layer. That is, the thermoelectric conversion element of the present example embodiment has a power generation layer containing a magnetic alloy material containing chromium of equal to or more than 10 wt % and equal to or less than 25 wt %. Since the thermoelectric conversion element of the present example embodiment is composed mainly of an FeAlCr alloy obtained by adding Al to an Fe alloy containing Cr of stainless steel, the thermoelectric conversion element of the present example embodiment is less susceptible to corrosion and less expensive than the thermoelectric conversion element of the first example embodiment.

That is, according to the present example embodiment, it is possible to provide a thermoelectric conversion element having a power generation layer having a large anomalous Nernst effect, a reduced material cost, and high corrosion resistance.

Third Example Embodiment

Next, a thermoelectric conversion element according to a third example embodiment of the present invention will be described with reference to the drawings. The thermoelectric conversion element of the present example embodiment includes a power generation layer having a structure in which a conductive magnetic layer (also referred to as first magnetic layer) exhibiting the anomalous Nernst effect and an insulating magnetic layer (also referred to as second magnetic layer) exhibiting the spin Seebeck effect are laminated.

Figure 3:
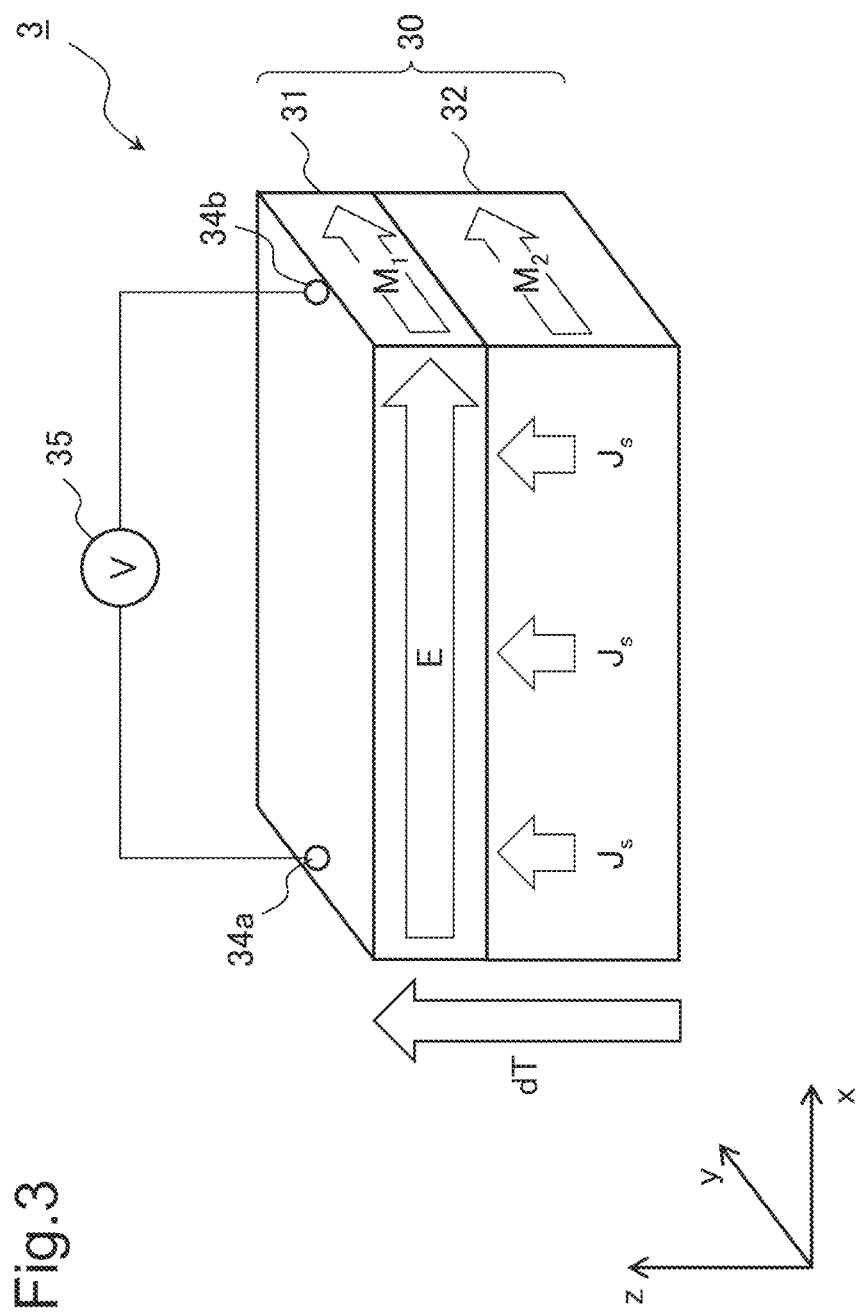
FIG. 3 is a conceptual diagram showing an example of a thermoelectric conversion element according to a third example embodiment of the present invention.

FIG. 3 is a conceptual diagram showing an example of a thermoelectric conversion element 3 of the present example embodiment. The thermoelectric conversion element 3 has a power generation layer 30 having a structure in which a first magnetic layer 31 and a second magnetic layer 32 are laminated. In FIG. 3, an electrode terminal 34a and an electrode terminal 34b are provided on one main surface of the power generation layer 30, and a voltmeter 35 for measuring a voltage between the electrode terminal 34a and the electrode terminal 34b is shown.

The first magnetic layer 31 is a layer of a magnetic material having a large anomalous Nernst effect. The first magnetic layer 31 has unidirectional (direction y in FIG. 3) magnetization $M_1$. The first magnetic layer 31 is a layer of an FeAl-based magnetic alloy material containing equal to or more than 70 wt % of Fe and Al in total. The first magnetic layer 31 is preferably made of the FeAl alloy of the first example embodiment or the FeAlCr alloy of the second example embodiment.

For example, the first magnetic layer 31 can be formed by sputtering, plating, vacuum deposition, or the like.

The first magnetic layer 31 has two roles. The first is a role of spin current-current conversion for converting a spin current flowing in by the spin Seebeck effect of the second magnetic layer 32 into an electromotive force (electric field $E_{SSE}$) by the inverse spin Hall effect (SSE: spin Seebeck effect). The second is a role of generating an electromotive force (electric field $E_{ANE}$) directly from a temperature gradient dT by the anomalous Nernst effect (ANE: anomalous Nernst effect).

The direction of the electric field $E_{ANE}$ generated by the anomalous Nernst effect is defined by the cross product of the magnetization $M_1$ of the first magnetic layer 31 and the temperature gradient dT as shown in the following Equation 1.

$$E_{ANE} \propto M_1 \times dT \quad (1)$$

The second magnetic layer 32 is a layer of a magnetic material exhibiting the spin Seebeck effect. The second magnetic layer 32, like the first magnetic layer 31, has unidirectional (direction y in FIG. 3) magnetization $M_2$. The second magnetic layer 32 contains a magnetic material such as yttrium iron garnet (YIG), Bi-added YIG (Bi:YIG), or nickel-zinc ferrite (NiZn ferrite). For example, yttrium iron garnet is exemplified by $Y_3Fe_5O_{12}$ and $BiY_2Fe_5O_{12}$ to which Bi is added. For example, NiZn ferrite is exemplified by $(Ni,Zn)_xFe_{3-x}O_4$ (x is a positive number equal to or less than one).

For example, the second magnetic layer 32 can be formed by sputtering, metal-organic decomposition, pulsed laser deposition, sol-gel processing, aerosol deposition, ferrite plating, liquid phase epitaxy, or the like. In this case, the thermoelectric conversion element 3 is formed on some substrate.

In the second magnetic layer 32, when the temperature gradient dT in the out-of-plane direction (direction z in FIG. 3) is applied to the main surface, a spin current Js is generated by the spin Seebeck effect. The direction of the spin current Js is parallel or antiparallel (direction z of FIG. 3) to the direction (direction z in FIG. 3) of the temperature gradient dT. In the example of FIG. 3, when the temperature gradient dT in direction +z is applied to the second magnetic layer 32, a spin current Js along direction +z or direction −z is generated. When the spin current Js is generated at the interface between the first magnetic layer 31 and the second magnetic layer 32, an electromotive force in the in-plane direction is generated in the first magnetic layer 31 by the inverse spin Hall effect.

The second magnetic layer 32 preferably has a small thermal conductivity from the viewpoint of thermoelectric conversion efficiency. Hence, it is desirable to use a magnetic insulator having no conductivity or a magnetic semiconductor having a relatively large electric resistance as the second magnetic layer 32.

The direction of the electric field $E_{SSE}$ generated by the spin Seebeck effect is defined by the cross product of the magnetization $M_2$ of the second magnetic layer 32 and the temperature gradient dT as shown in the following Equation 2.

$$E_{SSE} \propto M_2 \times dT \quad (2)$$

While the sign of the actual electric field depends on the material, in the case of the element configuration of the thermoelectric conversion element 3, if the directions of the magnetization $M_1$ and the magnetization $M_2$ are the same, both the electric field $E_{SSE}$ and the electric field $E_{ANE}$ are generated in the same direction for a certain temperature gradient dT. Accordingly, under such conditions, the anomalous Nernst effect and the spin-Seebeck effect reinforce each other, and the absolute value of the electric field to be generated becomes a value ($E_{Hybrid}$) obtained by adding the electromotive force generated by the two effects, as shown in the following Equation 3.

$$|E_{Hybrid}| = |E_{SSE}| + |E_{ANE}| \ldots \quad (3)$$

In the example of FIG. 3, the directions of the magnetization $M_1$ of the first magnetic layer 31 and the magnetization $M_2$ of the second magnetic layer 32 are direction +y, the direction of the temperature gradient dT is direction +z, and the direction of the electromotive force generated in the first magnetic layer 31 is direction +x.

In order to effectively perform thermoelectric conversion in the power generation layer 30, it is required to maintain the temperature gradient dT. In order to maintain the temperature gradient dT, the thickness of the second magnetic layer 32 is preferably equal to or more than 1 μm. In order for the spin Seebeck effect to be developed effectively, it is required to avoid the effect of dissipation of the spin current in the film. In order to avoid the effect of dissipation of the spin current in the film, the film thickness of the first magnetic layer 31 is preferably equal to or less than 100 nm. In order to support the entire thermoelectric conversion element 3, a substrate may be provided below the second magnetic layer 32.

As described above, the thermoelectric conversion element of the present example embodiment has a power generation layer having a structure in which a first magnetic layer exhibiting the anomalous Nernst effect and a second magnetic layer exhibiting the spin Seebeck effect are laminated. That is, the thermoelectric conversion element of the present example embodiment has a power generation layer having a structure in which a first magnetic layer containing a magnetic alloy material and a second magnetic layer exhibiting the spin Seebeck effect by application of a temperature gradient are laminated. For example, the thickness of the first magnetic layer is preferably equal to or less than 100 nm.

In the thermoelectric conversion element of the present example embodiment, the anomalous Nernst effect and the spin Seebeck effect can be combined by the structure in which the first magnetic layer containing a magnetic alloy material and the second magnetic layer exhibiting the spin Seebeck effect by application of a temperature gradient are laminated. Hence, according to the thermoelectric conversion element of the present example embodiment, a larger thermoelectromotive force than that of the thermoelectric conversion elements of the first and second example embodiments can be generated.

Fourth Example Embodiment

Next, a thermoelectric conversion element according to a fourth example embodiment of the present invention will be described with reference to the drawings. The thermoelectric conversion element of the present example embodiment includes a power generation layer having a structure in which a conductive magnetic network exhibiting the anomalous Nernst effect and insulating magnetic particles exhibiting the spin Seebeck effect are combined.

Figure 4:
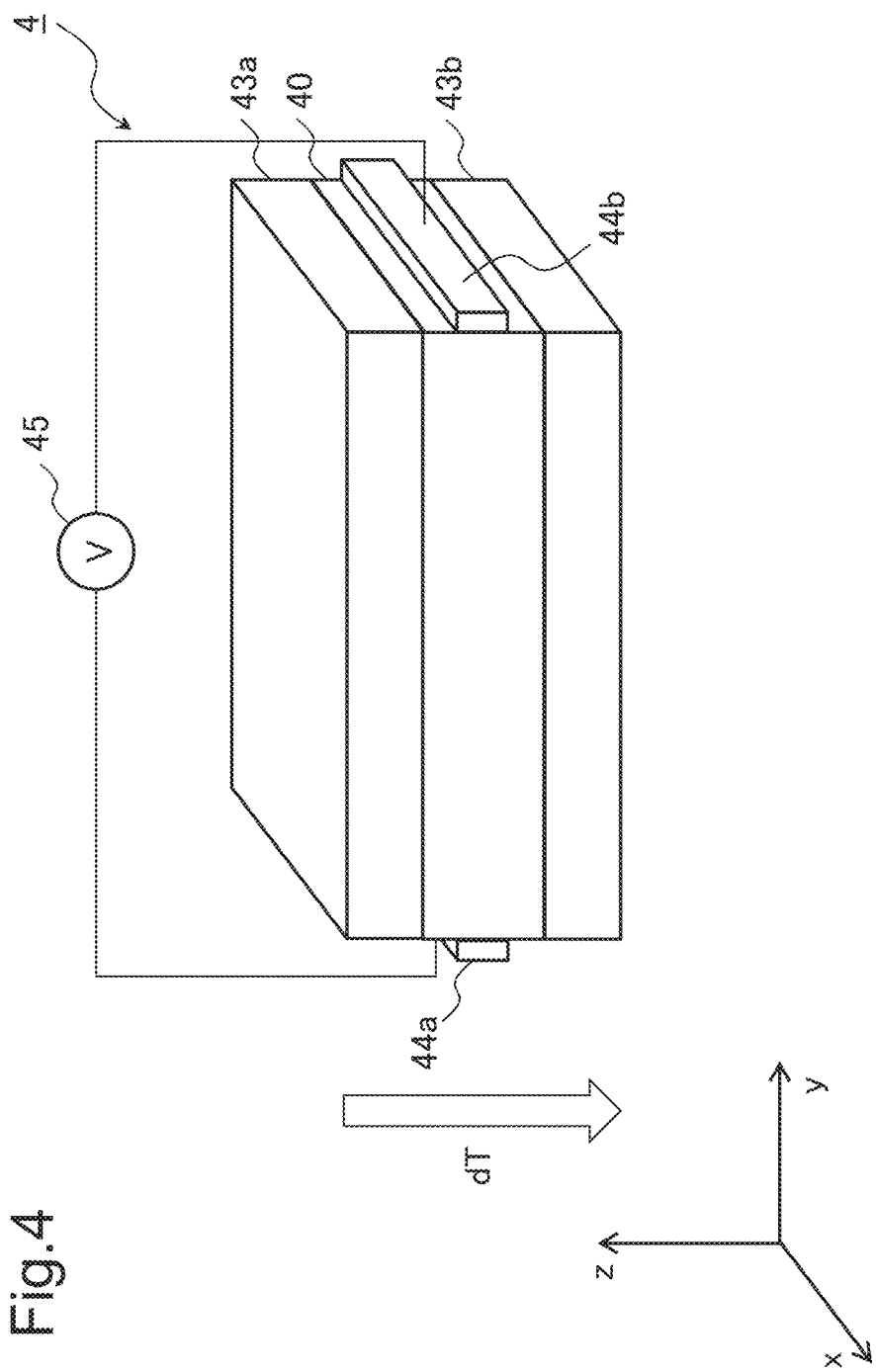
FIG. 4 is a conceptual diagram showing an example of a thermoelectric conversion element according to a fourth example embodiment of the present invention.

FIG. 4 is a conceptual diagram showing an example of a thermoelectric conversion element 4 of the present example embodiment. The thermoelectric conversion element 4 has a structure in which a power generation layer 40 is sandwiched between a first support layer 43a and a second support layer 43b. In FIG. 4, an electrode terminal 44a and an electrode terminal 44b are provided on two end surfaces of the power generation layer 40 facing each other, and a voltmeter 45 for measuring a voltage between the electrode terminal 44a and the electrode terminal 44b is shown.

Figure 5:
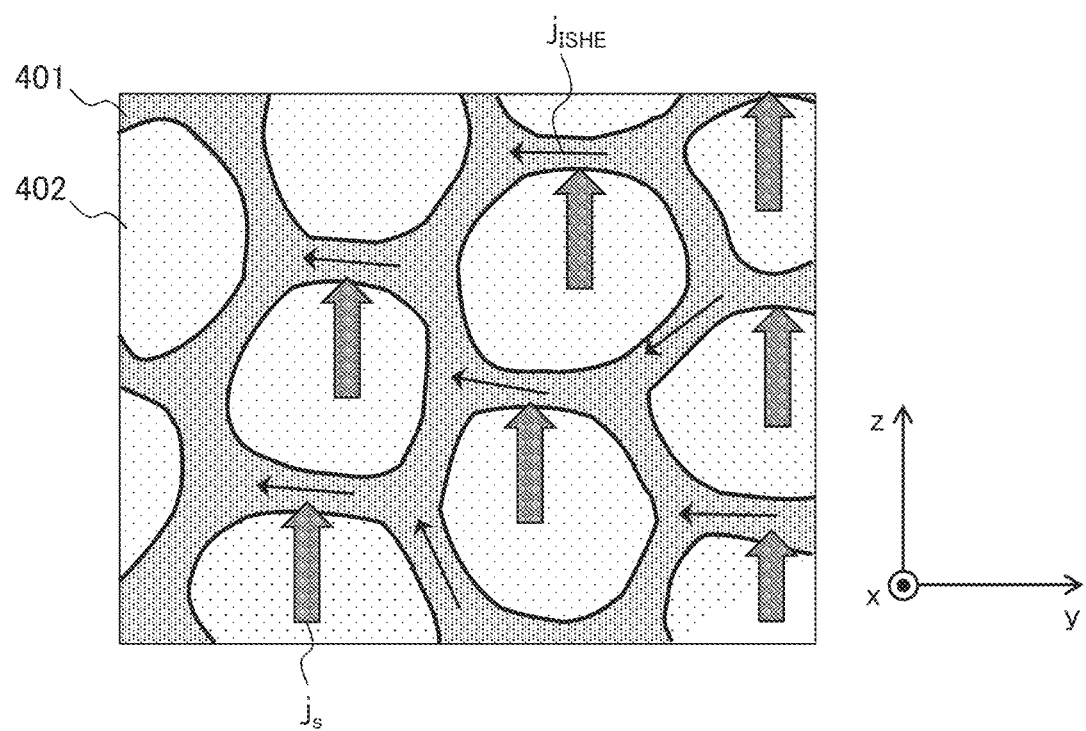
FIG. 5 is a conceptual diagram showing an example of a structure of an iron-aluminum alloy network included in the thermoelectric conversion element according to the fourth example embodiment of the present invention.

FIG. 5 is a conceptual diagram showing an example of the structure of the power generation layer 40. FIG. 5 is a diagram of a cross section of the power generation layer 40 cut along the zy-plane viewed from a viewpoint in direction +x. The power generation layer 40 includes a magnetic network 401 and granular magnetic particles 402 dispersed inside the magnetic network 401. In other words, in the power generation layer 40, the granular magnetic particles 402 are arranged in isolation from each other, and the magnetic network 401 spreads in a net-like shape in such a way as to fill the gap between the grains of the magnetic particles 402.

The magnetic network 401 includes a magnetic material having a large anomalous Nernst effect. The magnetic network 401 is a network structure of an FeAl-based magnetic alloy material containing equal to or more than 70 wt % of Fe and Al in total. The magnetic network 401 is preferably made of the FeAl alloy of the first example embodiment or the FeAlCr alloy of the second example embodiment.

Inside the power generation layer 40, a three-dimensional network structure of the magnetic network 401 allows electric connection between the electrode terminal 44a and the electrode terminal 44b.

The magnetic particles 402 contain a magnetic material exhibiting the spin Seebeck effect. The magnetic particles 402 contain a magnetic material such as yttrium iron garnet (YIG) or nickel-zinc ferrite (NiZn ferrite). For example, yttrium iron garnet is exemplified by $Y_3Fe_5O_{12}$. For example, NiZn ferrite is exemplified by $(Ni,Zn,Fe)_3O_4$.

The magnetic particles 402 have magnetization in the in-plane direction (direction x in FIG. 5). In order to maximize the power generation efficiency, it is desirable that the grain size of each magnetic particle 402 is about the relaxation length of the spin current (magnon current) induced by the spin Seebeck effect. Specifically, it is desirable that the average grain size of the magnetic particles 402 is equal to or more than 300 nm and equal to or less than 10 μm.

On both main surfaces of the power generation layer 40, the first support layer 43a and the second support layer 43b are arranged. The first support layer 43a is arranged on an upper surface (also referred to as first surface) of the power generation layer 40. The second support layer 43b is arranged on a lower surface (also referred to as second surface) of the power generation layer 40. In the thermoelectric conversion element 4, the first support layer 43a and the second support layer 43b support the power generation layer 40, to increase the strength of the entire element.

For the first support layer 43a and the second support layer 43b, it is desirable to use an insulator material that does not conduct electricity or a semiconductor material having a resistivity equal to or more than one ohmmeter (Ωm) in order to take out the electromotive force generated in the power generation layer 40 without loss.

It is desirable that the material forming the first support layer 43a and the second support layer 43b has a lower melting point than the metal material or magnetic insulator material forming the power generation layer 40 for convenience of preparing the thermoelectric conversion element 4. The magnetic particles 402 exhibiting the spin Seebeck effect are used in a temperature range equal to or less than the Curie temperature of the magnetic material contained in the magnetic particles 402. Hence, to prevent the first support layer 43a and the second support layer 43b from melting in the temperature range equal to or less than the Curie temperature of the magnetic material contained in the magnetic particles 402, the melting point of the material of the first support layer 43a and the second support layer 43b is preferably higher than the Curie temperature of the magnetic particles 402.

That is, when the thermoelectric conversion element 4 is prepared, the sintering temperature of the thermoelectric conversion element 4 is set between the minimum sintering temperature of the first support layer 43a and the second support layer 43b and the minimum sintering temperature of the power generation layer 40. Thus, if a material having a low melting point (and sintering temperature) is used as the first support layer 43a and the second support layer 43b, the thermoelectric conversion element 4 can be integrally solidified with high strength by low-temperature heat treatment at a temperature lower than the original sintering temperature of the power generation layer 40.

For example, assume that the magnetic particles 402 are made of a ferritic material having a Curie temperature of 300° C. to 400° C. and a melting point of 1200° C. to 1700° C. In this case, it is desirable that the melting point of the material forming the first support layer 43a and the second support layer 43b is equal to or more than 400° C. and equal to or less than 1200° C. Specifically, bismuth oxide $Bi_2O_3$, molybdenum oxide $MoO_3$, germanium oxide $GeO_2$, and the like are suitable for the material forming the first support layer 43a and the second support layer 43b.

The electrode terminal 44a and the electrode terminal 44b are provided on two side end surfaces of the power generation layer 40 facing each other. In FIG. 4, the electrode terminal 44a is provided on the side end surface on the −y side (also referred to as third surface), and the electrode terminal 44a is disposed on the side end surface on the +y side (also referred to as fourth surface). The electrode terminal 44a and the electrode terminal 44b are terminals for taking out a thermoelectromotive force generated in direction y by a temperature gradient dT applied in direction −z. The electrode terminal 44a and the electrode terminal 44b are made of a conductive material.

When the temperature gradient dT in the out-of-plane direction (direction z of FIG. 4) is applied to the thermoelectric conversion element 4 having the structure shown in FIG. 4, the spin Seebeck effect develops in the magnetic particles 402. When the spin Seebeck effect develops in the magnetic particles 402, as shown in FIG. 5, a spin current $J_s$ is generated at the interface between the magnetic network 401 and the magnetic particles 402. When a spin current $J_s$ is generated at the interface between the magnetic network 401 and the magnetic particles 402, an electromotive force in the in-plane direction is generated in the magnetic network 401 by the inverse spin Hall effect. FIG. 5 conceptualizes and illustrates a state in which a current $j_{ISHE}$ flows inside the magnetic network 401 due to the inverse spin Hall effect (ISHE: inverse spin Hall effect). Since the magnetic network 401 spreads in a network-like shape and is dispersed in the power generation layer 40, electromotive forces generated in parts of the composite body are added as a whole, and the electromotive force in the in-plane direction (direction y in FIG. 4) is obtained through the electrode terminal 44a and the electrode terminal 44b.

As described above, the thermoelectric conversion element of the present example embodiment has a structure in which magnetic particles exhibiting the spin Seebeck effect are dispersed and held in a magnetic network exhibiting the anomalous Nernst effect. That is, the thermoelectric conversion element of the present example embodiment has a power generation layer configured of a magnetic network containing a magnetic alloy material and magnetic particles dispersed in the magnetic network and exhibiting the spin Seebeck effect by application of a temperature gradient.

In the structure of the thermoelectric conversion element of the third example embodiment, since the spin current in the second magnetic layer relaxes, the power generation efficiency does not increase efficiently even if the power generation layer is made thicker. On the other hand, according to the thermoelectric conversion element of the present example embodiment, by the composite structure of the magnetic network exhibiting the anomalous Nernst effect and the magnetic particles exhibiting the spin Seebeck effect, the power generation efficiency is efficiently increased by thickening the power generation layer.

Next, the thermoelectric conversion elements according to the first to fourth example embodiments will be specifically described with reference to examples (Example 1 to 4).

Example 1

Figure 6:
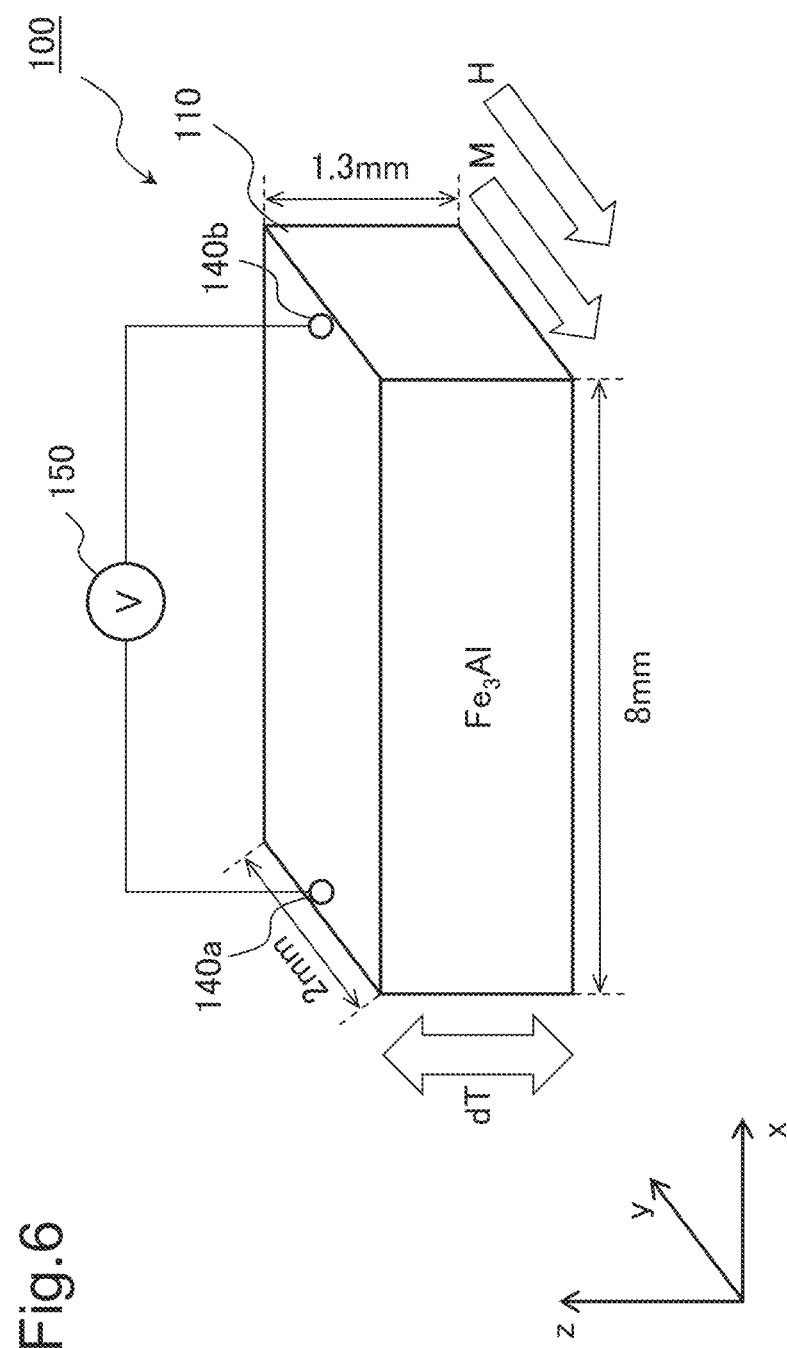
FIG. 6 is a conceptual diagram showing an example of a thermoelectric conversion element according to Example 1 of the present invention.

First, an example (Example 1) of the thermoelectric conversion element of the first example embodiment will be described with reference to the drawings. FIG. 6 is a conceptual diagram of a thermoelectric conversion element 100 of Example 1. The thermoelectric conversion element 100 has a power generation layer 110 containing an $Fe_3Al$ bulk alloy. In Example 1, as shown in FIG. 6, an electrode terminal 140a and an electrode terminal 140b are provided on one main surface of the power generation layer 110, and a voltmeter 150 is provided between the electrode terminal 140a and the electrode terminal 140b. In Example 1, there are four examples (Examples 1-1 to 1-4) regarding $Fe_3Al$ bulk alloys of the same composition prepared using different raw materials and processes. In the following, examples will be given in which thermoelectric performances of samples of the $Fe_3Al$ bulk alloys according to the examples (Examples 1-1 to 1-4) are evaluated, and the thermoelectric performances are compared.

Example 1-1

In Example 1-1, the power generation layer 110 ($Fe_3Al$ bulk alloy) was prepared by powder metallurgy using a spark plasma sintering device. First, an Fe powder having an average grain size of 4 μm and an Al powder having an average grain size of 3 μm were mixed at an atomic composition ratio of 3:1, and the two were mixed in a mortar for 40 minutes in such a manner as to be uniformly mixed, to prepare a mixed powder. Next, the mixed powder was packed into a graphite mold and sintered under a pressure of 50 megapascal (MPa) at 900° C. for one hour in a vacuum to alloy $Fe_3Al$.

Figure 7:
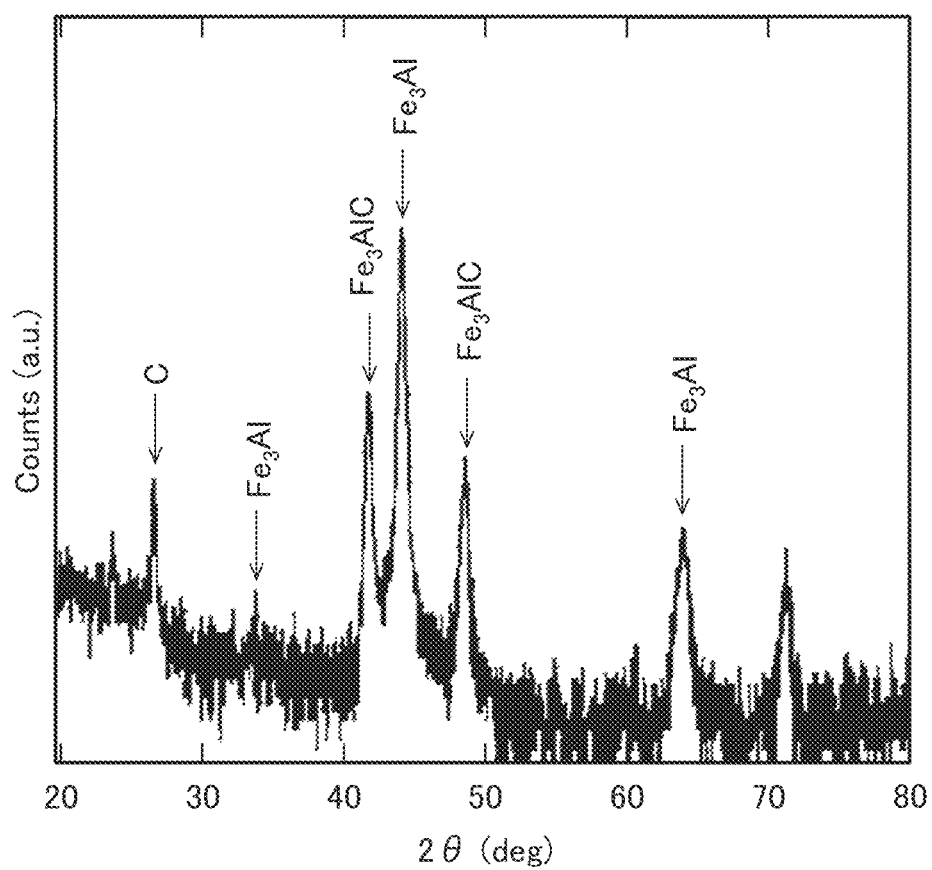
FIG. 7 is an X-ray diffraction pattern of a magnetic material ($Fe_3Al$ alloy) used in a thermoelectric conversion element according to Example 1-1 of the present invention.

FIG. 7 is an X-ray diffraction spectrum obtained by X-ray diffraction measurement performed to examine the crystal structure of the prepared $Fe_3Al$ bulk alloy. From the X-ray diffraction spectrum of FIG. 7, it was confirmed that $Fe_3Al$ is the main component although components alloyed with carbon (C) are contained.

Figure 8:
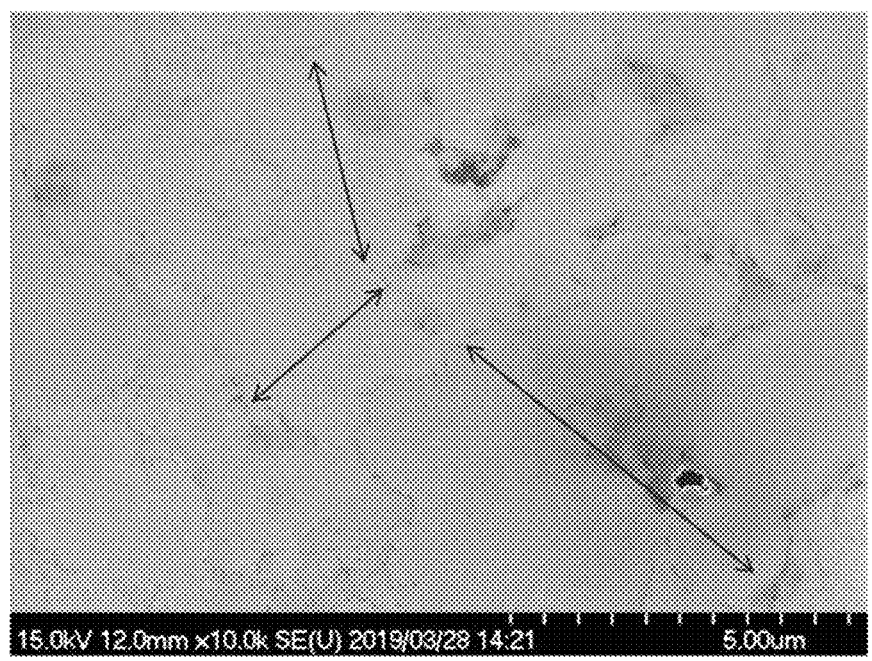
FIG. 8 is an image of a sample obtained by polishing a magnetic material (iron-aluminum alloy) according to Example 1-1 of the present invention, captured by a scanning electron microscope (SEM).

FIG. 8 is an image of a material structure of a sample obtained by polishing the $Fe_3Al$ bulk alloy prepared by the method of Example 1-1, captured by a scanning electron microscope (SEM). The arrows shown in FIG. 8 are indications of the crystal grain size. As shown in FIG. 8, the crystal grain size of the $Fe_3Al$ bulk alloy prepared by the method of Example 1-1 was similar to the crystal grain size of the raw material powder (3 μm to 10 μm).

Next, in order to examine the thermoelectric conversion characteristics of the thermoelectric conversion element 100, the thermoelectromotive force was measured by applying the temperature gradient dT to the thermoelectric conversion element 100 in the setup shown in FIG. 6. In the example of FIG. 6, the sintered body (power generation layer 110) was cut out in such a way that the length in the electromotive force extraction direction (direction x in FIG. 6) is 8 mm, the width in the magnetization direction (direction y in FIG. 6) is 2 mm, and the thickness in the temperature difference application direction (direction z in FIG. 6) is 1.3 mm. On the main surface of the cut out power generation layer 110, the electrode terminal 140a and the electrode terminal 140b were arranged in the vicinity of both ends in the electromotive force extraction direction (direction x in FIG. 6).

When the electromotive force due to thermoelectric conversion was measured, a copper block having a width of 5 mm was pressed against the center of both main surfaces of the thermoelectric conversion element 100 from above and below, and the temperature gradient dT was applied by heating one surface and cooling the other surface. Accordingly, while the distance between the electrode terminals is about 8 mm, the area of the region where the thermoelectromotive force is actually generated with application of the temperature difference is the product of the width of the copper block (5 mm) and the width of the thermoelectric conversion element 100 (2 mm) (10 mm$^2$).

Figure 9:
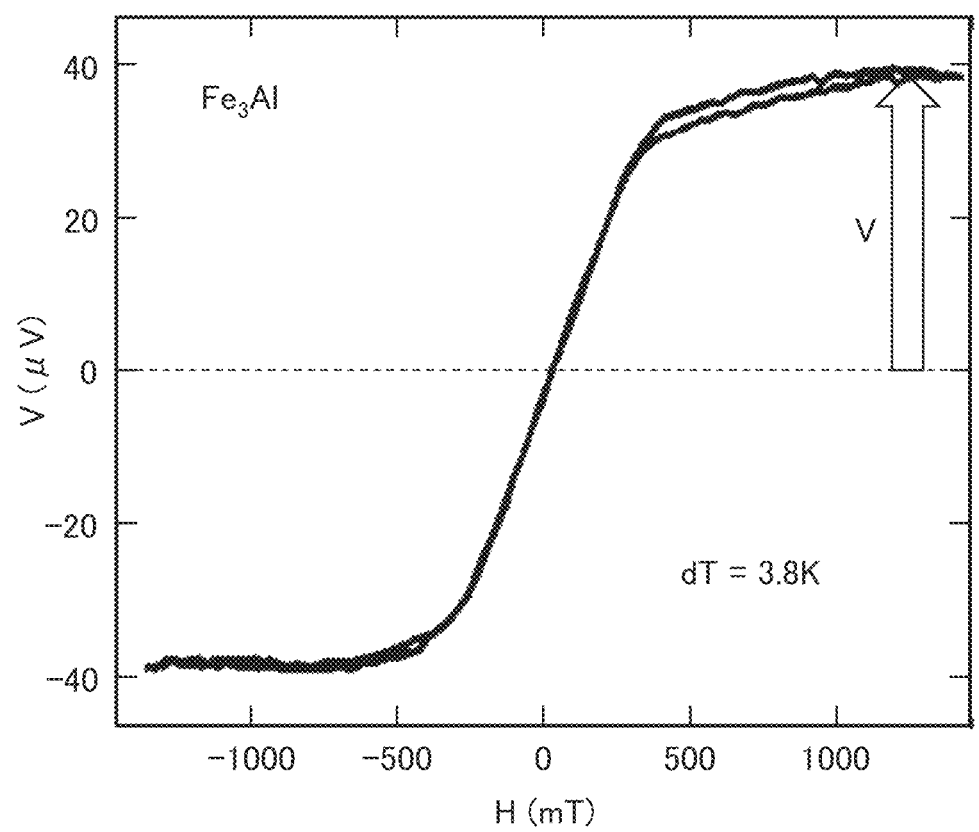
FIG. 9 is a graph showing the external magnetic field dependence of a thermoelectromotive force of the thermoelectric conversion element according to the Example 1 of the present invention.

FIG. 9 is a graph showing the external magnetic field H dependence of the output voltage V generated when a temperature gradient dT of 3.8 Kelvin (K) is applied between both main surfaces of the thermoelectric conversion element 100. As shown in FIG. 9, a thermoelectromotive force was generated in a direction perpendicular to the directions of both the temperature gradient dT and the external magnetic field H (magnetization M), and an output voltage V was generated between the electrode terminal 140a and the electrode terminal 140b. In Example 1-1, an output voltage V/dT per unit temperature difference of the power generation layer 110 ($Fe_3Al$) was 10.1 μV/K.

Figure 10:
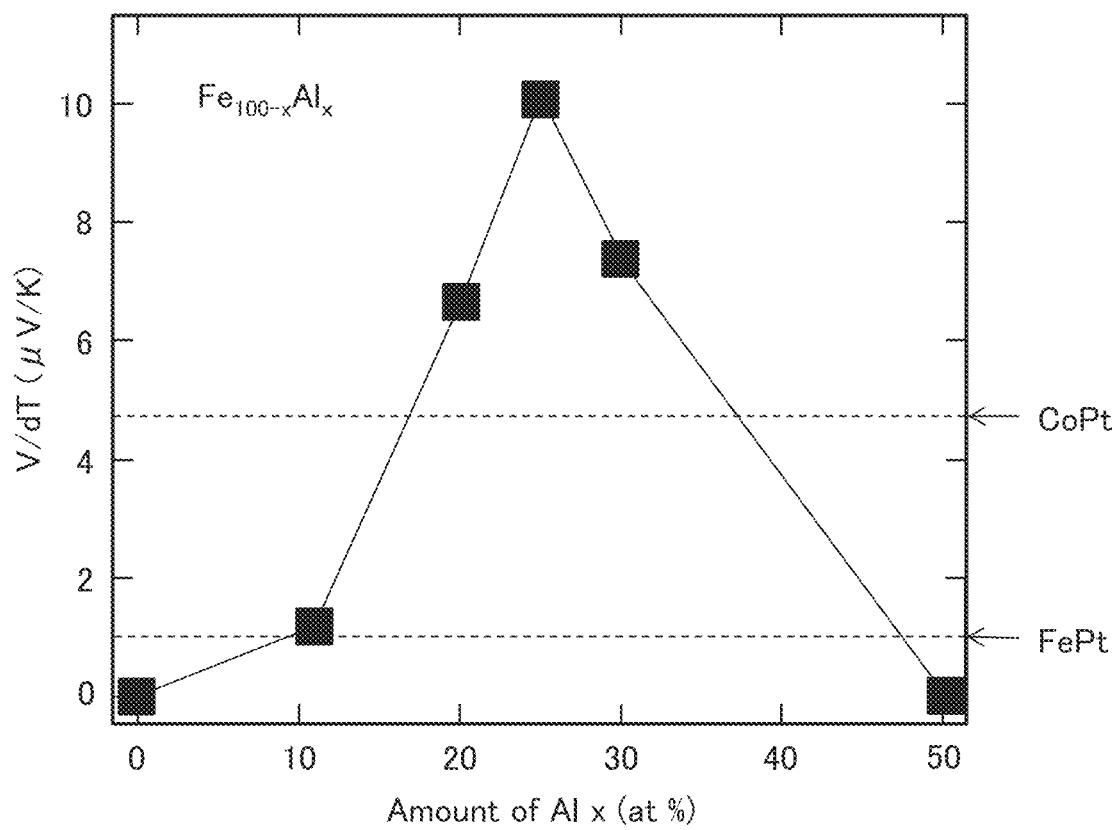
FIG. 10 is a graph showing the material composition dependence of the thermoelectromotive force of the magnetic material (iron-aluminum alloy) used in the thermoelectric conversion element according to Example 1 of the present invention.

Next, in order to investigate the composition dependence of the anomalous Nernst effect in the FeAl bulk alloy, multiple thermoelectric conversion elements 100 having different Al content ratios were prepared, and the thermoelectromotive force of each thermoelectric conversion element 100 was measured. FIG. 10 is a graph showing the dependence of the output voltage V/dT (also referred to as thermoelectric performance) per unit temperature difference on Al composition (atomic ratio). For comparison, FIG. 10 shows, in dotted lines, the thermoelectric performance V/dT of bulk alloy elements having a composition of FePt (atomic ratio Fe:Pt=1:1) and CoPt (atomic ratio Co:Pt=1:1), for which a large anomalous Nernst effect is suggested in NPL 1 and the like. These comparison elements were sintered and prepared under similar conditions as those of the FeAl bulk alloy element.

As shown in FIG. 10, the thermoelectric performance V/dT was larger than that of the bulk CoPt alloy and the bulk FePt alloy in the composition range where the composition ratio of Al is more than 20 at % (over 10 wt %) and less than 30 at % (less than 17 wt %). In particular, when the atomic composition ratio of Al was 25%, that is, $Fe_3Al$, the thermoelectric performance V/dT was maximized.

Example 1-2

In Example 1-2, a raw material powder ($Fe_3Al$ alloy powder) having an average grain size larger than that of Example 1-1 was used to prepare an $Fe_3Al$ bulk alloy having the composition that maximized the thermoelectric performance in Example 1-1 by powder metallurgy as in Example 1-1. In Example 1-2, an $Fe_3Al$ alloy powder having an average grain size of 50 μm was packed into a graphite mold and sintered under a pressure of 50 MPa at 800° C. for 10 minutes in a vacuum having a degree of vacuum lower than one pascal (Pa) to alloy $Fe_3Al$.

As a result of X-ray diffraction measurement to examine the crystal structure of the $Fe_3Al$ bulk alloy of Example 1-2, similar polycrystalline characteristics as in Example 1-1 were obtained, while the crystal grain size was about the same as the grain size of the raw material powder (~50 μm).

Figure 11:
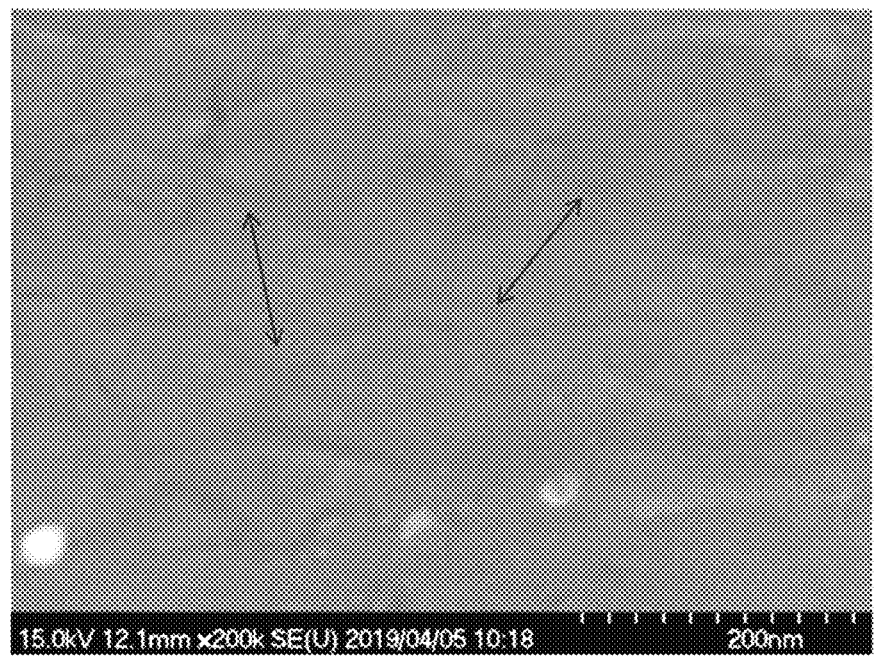
FIG. 11 is an image of a sample obtained by polishing a magnetic material (iron-aluminum alloy) according to Example 1-2 of the present invention, captured by an SEM.

FIG. 11 is an image of the $Fe_3Al$ bulk alloy prepared by the method of Example 1-2, captured by SEM as in Example 1-1. The arrows shown in FIG. 11 are indications of the crystal grain size. As shown in FIG. 11, the crystal grain size of the $Fe_3Al$ bulk alloy prepared by the method of Example 1-2 was similar to the crystal grain size of the raw material powder (50 μm to 100 μm).

As in Example 1-1, the sintered body of the $Fe_3Al$ bulk alloy of Example 1-2 was cut into a size of 8 mm×2 mm×1.3 mm, and the thermoelectric conversion characteristics were examined. As a result, the output voltage V/dT per unit temperature difference of the $Fe_3Al$ bulk alloy of Example 1-2 was 6.6 μV/K. As described above, the $Fe_3Al$ bulk alloy of Example 1-2 was inferior to the $Fe_3Al$ bulk alloy of Example 1-1 in thermoelectric conversion characteristics.

Example 1-3

In Example 1-3, unlike Examples 1-1 and 1-2, the $Fe_3Al$ bulk alloy having the composition that maximized the thermoelectric performance in Example 1-1 was prepared by arc melting. First, an FeAl raw material was prepared by mixing a granular mass of iron (Fe) and a granular mass of aluminum (Al) at an atomic ratio of 3:1 (weight ratio 85.7:14.3). Next, the FeAl raw material was charged into an arc melting device. Then, in an argon atmosphere at a reduced pressure of −0.03 MPa, the FeAl raw material was melted by setting up a plasma by arc discharge with a tungsten tip close to the FeAl raw material, and $Fe_3Al$ was alloyed by quenching.

Generally, the crystal grain size of an alloy prepared by arc melting is about several hundred μm, which is larger than the crystal grain size of an alloy prepared by sintering. The crystal grain size of the $Fe_3Al$ bulk alloy prepared in Example 1-3 was about several hundred μm, which was actually larger than the crystal grain size of the $Fe_3Al$ bulk alloy of Example 1-1 or Example 1-2.

As in Example 1-1, the sintered body of the $Fe_3Al$ bulk alloy of Example 1-3 was cut into a size of 8 mm×2 mm×1.3 mm, and the thermoelectric conversion characteristics were examined. As a result, the output voltage V/dT per unit temperature difference of the $Fe_3Al$ bulk alloy of Example 1-2 was 6.2 μV/K. As described above, the $Fe_3Al$ bulk alloy of Example 1-3 was inferior to the $Fe_3Al$ bulk alloy of Example 1-1 in thermoelectric conversion characteristics.

Example 1-4

In Example 1-4, unlike Examples 1-1 to 1-3, the $Fe_3Al$ bulk alloy having the composition that maximized the thermoelectric performance in Example 1-1 was prepared by the pulling method (Czochralski method). In Example 1-4, a single-crystal $Fe_3Al$ alloy with no grain boundary whose crystal orientation is aligned in one direction was prepared by pulling up the $Fe_3Al$ raw material melt melted in the crucible under a temperature gradient.

As a result of X-ray diffraction measurement to examine the crystal structure of the $Fe_3Al$ alloy of Example 1-4, it was confirmed that a single-crystal $Fe_3Al$ alloy was obtained.

As in Example 1-1, the sintered body of the single-crystal $Fe_3Al$ alloy of Example 1-4 was cut into a size of 8 mm×2 mm×1.3 mm, and the thermoelectric conversion characteristics were examined. As a result, the output voltage V/dT per unit temperature difference of the single-crystal $Fe_3Al$ alloy of Example 1-4 was 5.0 μV/K. As described above, the single-crystal $Fe_3Al$ alloy of Example 1-4 was inferior to the $Fe_3Al$ bulk alloy of Example 1-1 in thermoelectric conversion characteristics.

Figure 12:
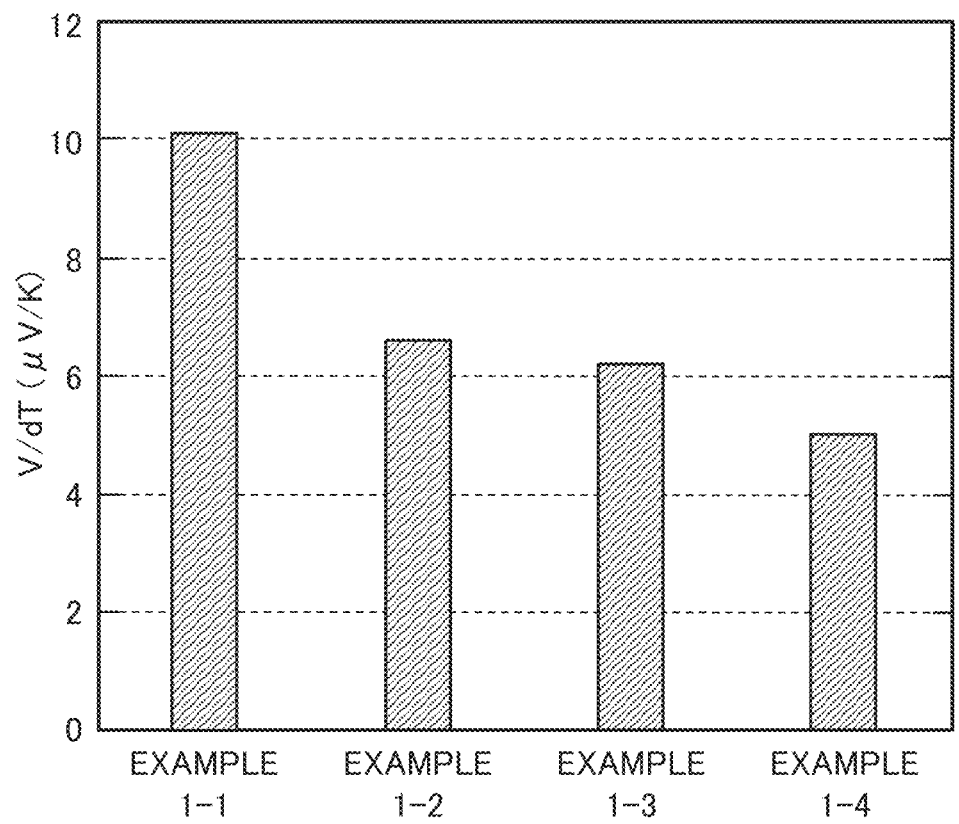
FIG. 12 is a graph showing the measurement results of the thermoelectromotive force of the magnetic materials (iron-aluminum alloy) according to Examples 1-1 to 1-4 of the present invention.

Here is a graph (FIG. 12) summarizing the evaluation results of the thermoelectric conversion characteristics of the $Fe_3Al$ bulk alloys of Examples 1-1 to 1-4 prepared under different preparation conditions. As shown in FIG. 12, a large electromotive force of about 10 μV/K was obtained in the $Fe_3Al$ bulk alloy of Example 1-1 which is a polycrystalline substance having a small crystal grain size. On the other hand, in the $Fe_3Al$ bulk alloy of Examples 1-2 to 1-3, which are polycrystalline substances having an average crystal grain size equal to or more than 50 μm, only about 60% of the electromotive force of the $Fe_3Al$ bulk alloy of Example 1-1 was obtained. In the single-crystalline $Fe_3Al$ bulk alloy with no grain boundary of Example 1-4, only an electromotive force equal to or less than half that of the $Fe_3Al$ bulk alloy of Example 1-1 was obtained. That is, as shown in FIG. 12, according to Example 1 (Examples 1-1 to 1-4), it was found that the smaller the crystal grain size, the better the thermoelectric conversion characteristics.

Figure 13:
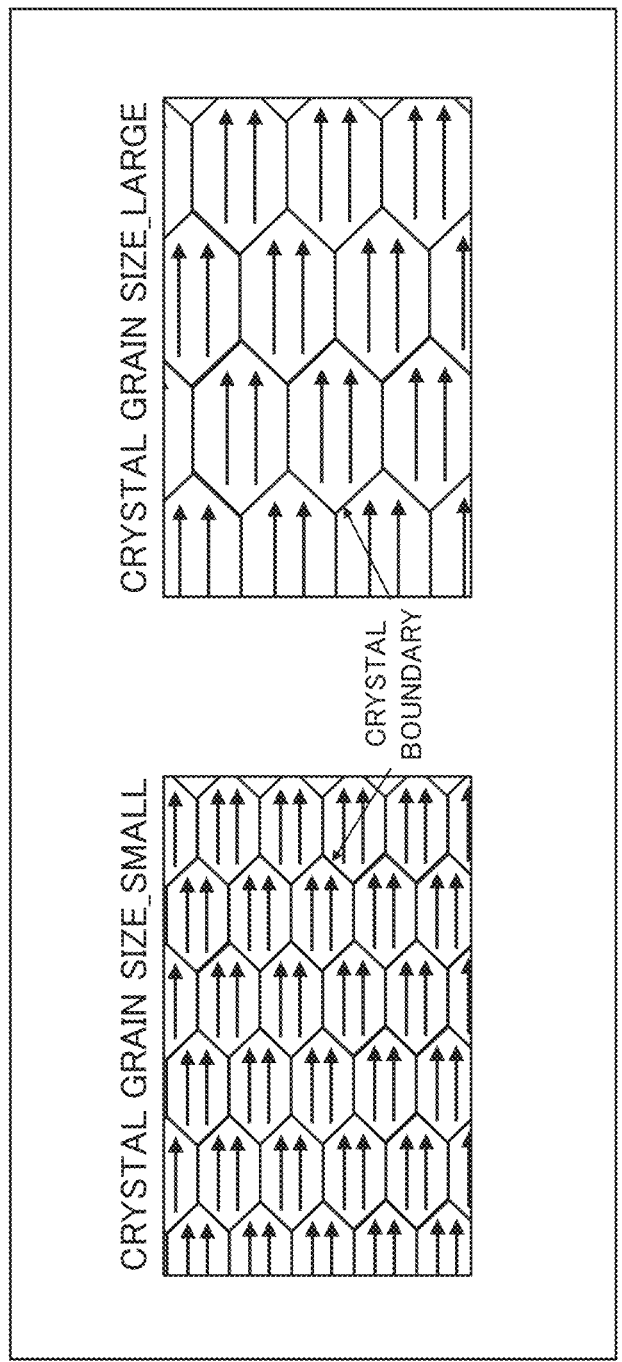
FIG. 13 is a conceptual diagram for explaining an effect of increasing thermoelectric performance at a crystal grain boundary of the magnetic material according to Example 1-1 of the present invention.

FIG. 13 is a conceptual diagram for explaining the relationship between the crystal grain size and the number of crystal grain boundaries. As shown in FIG. 13, the smaller the crystal grain size, the larger the number of grain boundaries in the $Fe_3Al$ bulk alloy. In other words, the smaller the crystal grain size, the greater the density of grain boundaries in the $Fe_3Al$ bulk alloy. That is, from the result of Example 1 (Examples 1-1 to 1-4), since the thermoelectric performance tends to improve as the number of grain boundaries in the $Fe_3Al$ bulk alloy increases, it can be estimated that the amount of conversion from heat flow (temperature difference) to current is increased by the grain boundaries. It can be inferred that accumulation of spin current caused by the spin Seebeck effect occurs at the grain boundary, and the spin current accumulated at the grain boundary is converted into a current by the inverse spin Hall effect to increase the electromotive force.

As described above, from the result of Example 1 (Examples 1-1 to 1-4), it is desirable that the FeAl-based alloy used for the power generation layer 110 is a polycrystalline substance having an average crystal grain size of less than 50 μm. Further, from the result of Example 1-1, it is more desirable that the average crystal grain size of the FeAl-based alloy used for the power generation layer 110 is less than 10 μm.

Example 2

Next, an example (Example 2) of the thermoelectric conversion element of the second example embodiment will be described with reference to the drawings. A thermoelectric conversion element of the present example includes an iron-aluminum-chromium alloy (FeAlCr alloy) in which aluminum (Al) is added to magnetic stainless steel SUS 630 as a power generation layer (SUS: steel use stainless).

Figure 14:
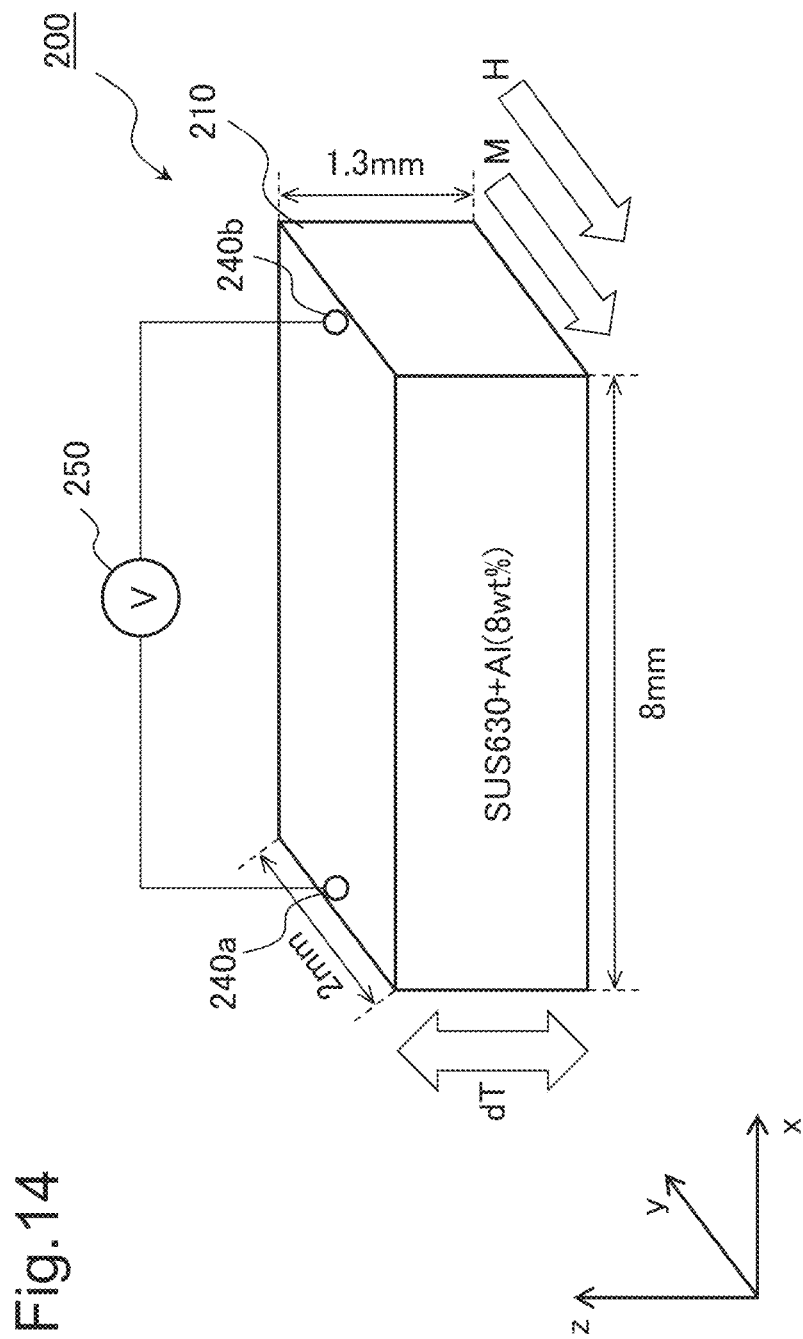
FIG. 14 is a conceptual diagram showing an example of a thermoelectric conversion element according to Example 2 of the present invention.

FIG. 14 is a conceptual diagram of a thermoelectric conversion element 200 of the present example. The thermoelectric conversion element 200 has a power generation layer 210 containing an FeAlCr alloy. In FIG. 14, an electrode terminal 240a and an electrode terminal 240b are provided on one main surface of the power generation layer 210, and a voltmeter 250 for measuring a voltage between the electrode terminal 240a and the electrode terminal 240b is shown.

The power generation layer 210 contains an FeAlCr alloy sintered and prepared by mixing Al with the magnetic stainless steel SUS 630. The magnetic stainless steel SUS 630 contains 75 wt % of iron (Fe), 16 wt % of chromium (Cr), 4 wt % of copper (Cu), 4 wt % of nickel (Ni), and 1% of manganese (Mn).

In the present example, the power generation layer 210 (FeAlCr alloy) was prepared by powder metallurgy using a spark plasma sintering device. First, an SUS 630 powder having an average grain size of 17 μm and an Al powder having an average grain size of 3 μm were mixed at a weight ratio of 92:8, and the two were mixed in a mortar for 40 minutes in such a manner as to be mixed uniformly to prepare a mixed powder. Next, the mixed powder was packed into a graphite mold and sintered under a pressure of 50 MPa at 900° C. for one hour in a vacuum to alloy FeAlCr.

Next, in order to examine the thermoelectric conversion characteristics of the thermoelectric conversion element 200, as in Example 1, the thermoelectromotive force was measured by applying a temperature gradient dT to the thermoelectric conversion element 200 in the setup shown in FIG. 14. In the example of FIG. 14, the sintered body (power generation layer 210) was cut out in such a way that the length in the electromotive force extraction direction (direction x in FIG. 14) is 8 mm, the width in the magnetization direction (direction y in FIG. 14) is 2 mm, and the thickness in the temperature difference application direction (direction z in FIG. 14) is 1.3 mm. On the main surface of the cut out power generation layer 210, the electrode terminal 240a and the electrode terminal 240b were arranged in the vicinity of both ends in the electromotive force extraction direction (direction x in FIG. 14).

Figure 15:
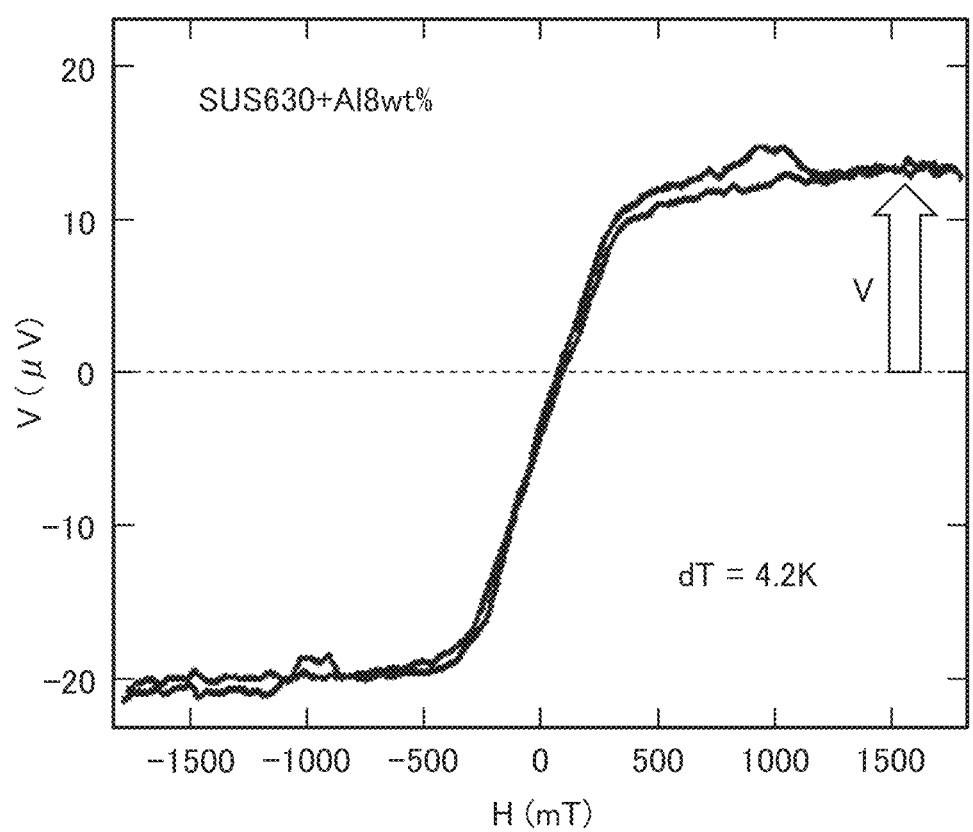
FIG. 15 is a graph showing the external magnetic field dependence of a thermoelectromotive force of the thermoelectric conversion element according to Example 2 of the present invention.

FIG. 15 is a graph showing the external magnetic field H dependence of an output voltage V generated when a temperature gradient dT of 4.2 Kelvin (K) is applied between both main surfaces of the thermoelectric conversion element 200. As shown in FIG. 15, a thermoelectromotive force was generated in a direction perpendicular to the directions of both the temperature gradient dT and the external magnetic field H (magnetization M), and the output voltage V was generated between the electrode terminal 240a and the electrode terminal 240b.

Figure 16:
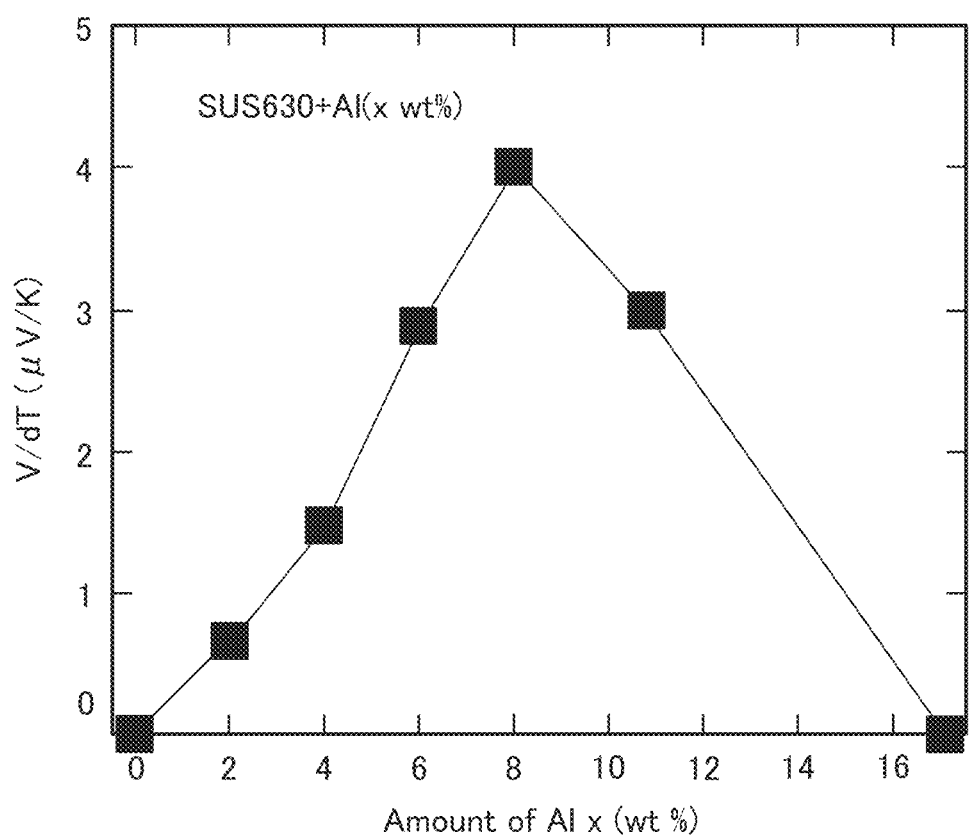
FIG. 16 is a graph showing the material composition dependence of the thermoelectromotive force of a magnetic material (SUS 630+aluminum alloy) used in the thermoelectric conversion element according to Example 1 of the present invention.

Next, in order to investigate the composition dependence of the anomalous Nernst effect in the FeAlCr alloy, multiple thermoelectric conversion elements 200 having different Al content ratios were prepared, and the thermoelectromotive force of each thermoelectric conversion element 200 was measured. FIG. 16 is a graph showing the dependence of an output voltage V/dT (also referred to as thermoelectric performance) per unit temperature difference on Al composition (atomic ratio).

As shown in FIG. 16, the thermoelectric performance V/dT increased in the composition range of 6 to 11 wt % Al. In particular, when the weight ratio of Al was 8%, the thermoelectric performance V/dT was maximized.

Example 3

Next, an example (Example 3) of the thermoelectric conversion element of the third example embodiment will be described with reference to the drawings. The thermoelectric conversion element of the present example includes a power generation layer having a structure in which a conductive magnetic layer (also referred to as first magnetic layer) exhibiting the anomalous Nernst effect and an insulating magnetic layer (also referred to as second magnetic layer) exhibiting the spin Seebeck effect are laminated.

In the present example, an FeAl alloy ($Fe_3Al$) was used for the first magnetic layer, and Bi-doped YIG (Bi:YIG) was used for the second magnetic layer. In the present example, a power generation layer was formed on an SGGG substrate (SGGG: substituted gadolinium gallium garnet). The SGGG substrate material includes gadolinium (Gd), calcium (Ca), gallium (Ga), magnesium (Mg), and zirconium (Zr), and is denoted as $(GdCa)_3(GaMgZr)_5O_{12}$.

Figure 17:
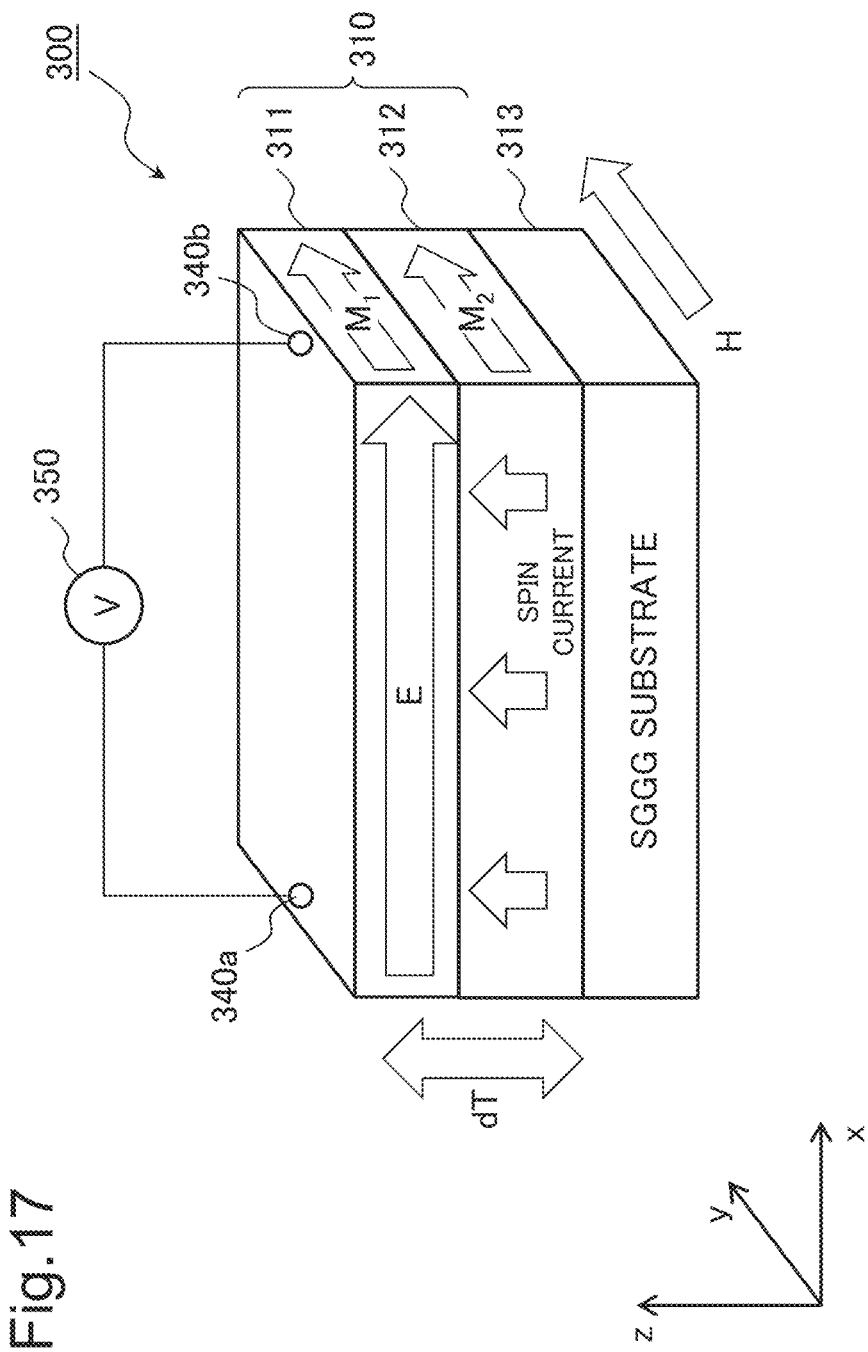
FIG. 17 is a conceptual diagram showing an example of a thermoelectric conversion element according to Example 3 of the present invention.

FIG. 17 is a conceptual diagram of a thermoelectric conversion element 300 of the present example. The thermoelectric conversion element 300 has a structure in which a power generation layer 310 formed by laminating a first magnetic layer 311 containing an $Fe_3Al$ bulk alloy and a second magnetic layer 312 containing Bi:YIG is laminated on an SGGG substrate 313. In FIG. 17, an electrode terminal 340a and an electrode terminal 340b are provided on one main surface of the power generation layer 310, and a voltmeter 350 for measuring a voltage between the electrode terminal 340a and the electrode terminal 340b is shown.

In the present example, on the SGGG substrate 313 having a thickness of 0.7 mm, a $BiY_2Fe_5O_{12}$ magnetic film was formed as the second magnetic layer 312, and on the second magnetic layer 312, an $Fe_3Al$ layer having a film thickness of 10 nm was formed as the first magnetic layer 311. First, the second magnetic layer 312 was formed on the SGGG substrate 313 by metal-organic decomposition which is a coating base film formation method. Specifically, a solution of an organic metal containing Bi, Y, and Fe dissolved in a solvent was applied onto the SGGG substrate 313 by spin coating (speed 1000 rpm), and then annealed at 700° C. to form the second magnetic layer 312 formed on the SGGG substrate 313. The first magnetic layer 311

(Fe₃Al) was formed on the second magnetic layer 312 by magnetron sputtering using a sintered and prepared Fe₃Al alloy target.

In order to confirm the performance of the thermoelectric conversion element 300 of the present example that combines the anomalous Nernst effect and the spin Seebeck effect, a comparison element (not shown) in which Fe₃Al having a film thickness of 10 nm is directly formed on a paramagnetic SGGG substrate was also prepared. In this comparison element, the contribution of the spin Seebeck effect is little, and the anomalous Nernst effect mainly contributes to the thermoelectric conversion.

Next, in order to examine the thermoelectric conversion characteristics of the thermoelectric conversion element 300, as in Example 1, the thermoelectromotive force was measured by applying a temperature gradient dT to the thermoelectric conversion element 300 in the setup shown in FIG. 17. In the present example, the thermoelectric properties of the thermoelectric conversion element 300 and the comparison element cut out to a size of 8 mm×2 mm were evaluated. On the main surface of the power generation layer 310, the electrode terminal 340a and the electrode terminal 340b are arranged in the vicinity of both ends.

As shown in FIG. 17, while the first magnetic layer 311 and the second magnetic layer 312 were magnetized in one direction (direction +y in FIG. 17), the temperature gradient dT was applied in the out-of-plane direction (direction z of FIG. 17), and the electromotive force generated in the longitudinal direction of the first magnetic layer 311 (direction x of FIG. 17) was measured. The electromotive force generated in the longitudinal direction (direction x of FIG. 17) of the first magnetic layer 311 is a value obtained by adding the spin Seebeck effect and the anomalous Nernst effect.

Figure 18:
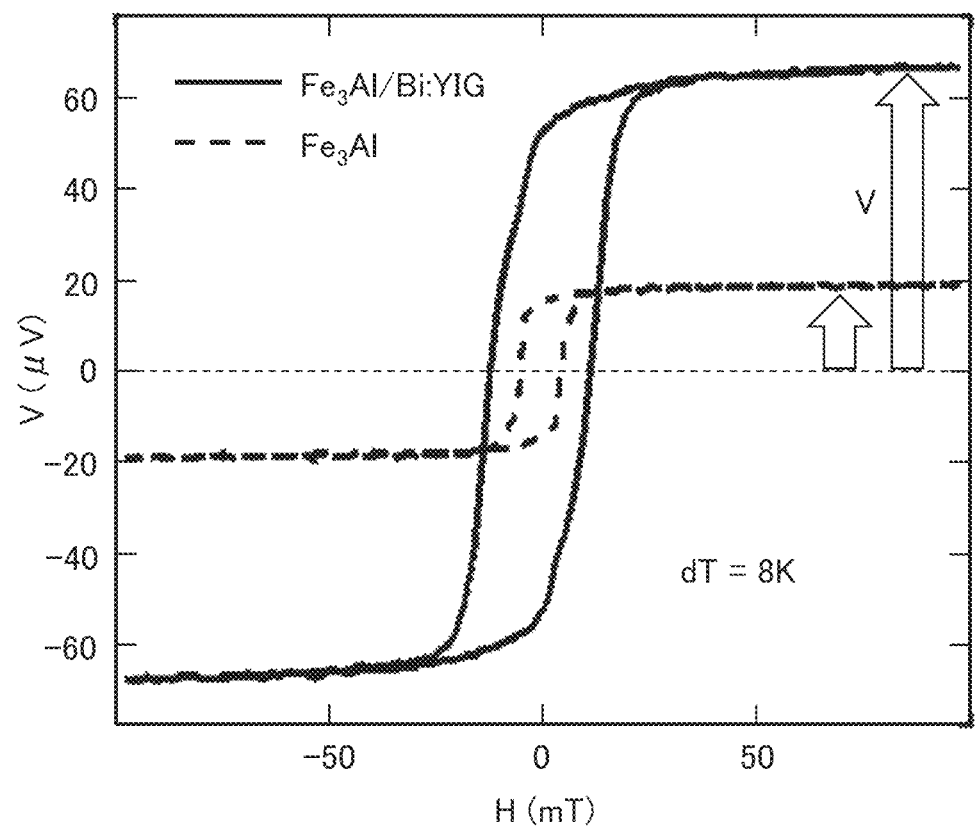
FIG. 18 is a graph showing the external magnetic field dependence of a thermoelectromotive force of the thermoelectric conversion element according to Example 3 of the present invention.

FIG. 18 is a graph showing the external magnetic field H dependence of an output voltage V generated when a temperature gradient dT of 8 Kelvin (K) is applied between both main surfaces of the thermoelectric conversion element 300. In FIG. 18, the solid line represents the measurement result of the thermoelectric conversion element 300 (Fe₃Al/Bi: YIG), and the broken line represents the measurement result of the comparison element (Fe₃Al). As shown in FIG. 18, a thermoelectromotive force was generated in the thermoelectric conversion element 300 in a direction perpendicular to the directions of both the temperature gradient dT and the external magnetic field H (magnetization M), and an output voltage V was generated between the electrode terminal 340a and the electrode terminal 340b. Similar to the thermoelectric conversion element 300, in the comparison element, too, a thermoelectromotive force was generated in a direction perpendicular to the directions of both the temperature gradient dT and the external magnetic field H (magnetization M), and an output voltage was generated between the electrode terminal 340a and the electrode terminal 340b. As shown in FIG. 18, a larger electromotive force was obtained in the thermoelectric conversion element 300 (Fe₃Al/Bi:YIG) exhibiting the anomalous Nernst effect and the spin Seebeck effect than in the comparison element (Fe₃Al) mainly exhibiting the anomalous Nernst effect.

Example 4

Next, an example (Example 4) of the thermoelectric conversion element of the fourth example embodiment will be described with reference to the drawings. The thermoelectric conversion element of the present example includes a power generation layer having a structure in which a conductive magnetic network exhibiting the anomalous Nernst effect and insulating magnetic particles exhibiting the spin Seebeck effect are combined.

In the present example, an FeAl alloy (Fe₃Al) was used for the magnetic network, and Bi-doped YIG (Bi:YIG) was used for the magnetic particles. In the thermoelectric conversion element of the present example, bismuth oxide (Bi:YIG) having a lower melting point than the magnetic particles (Bi₂O₃) was used as the first support layer 43a and the second support layer 43b. The melting point of Bi:YIG is 1555° C. and the melting point of Bi₂O₃ is 817° C. In the thermoelectric conversion element of the present example, an electrode terminal is formed by applying silver paste to an end surface of the power generation layer.

Figure 19:
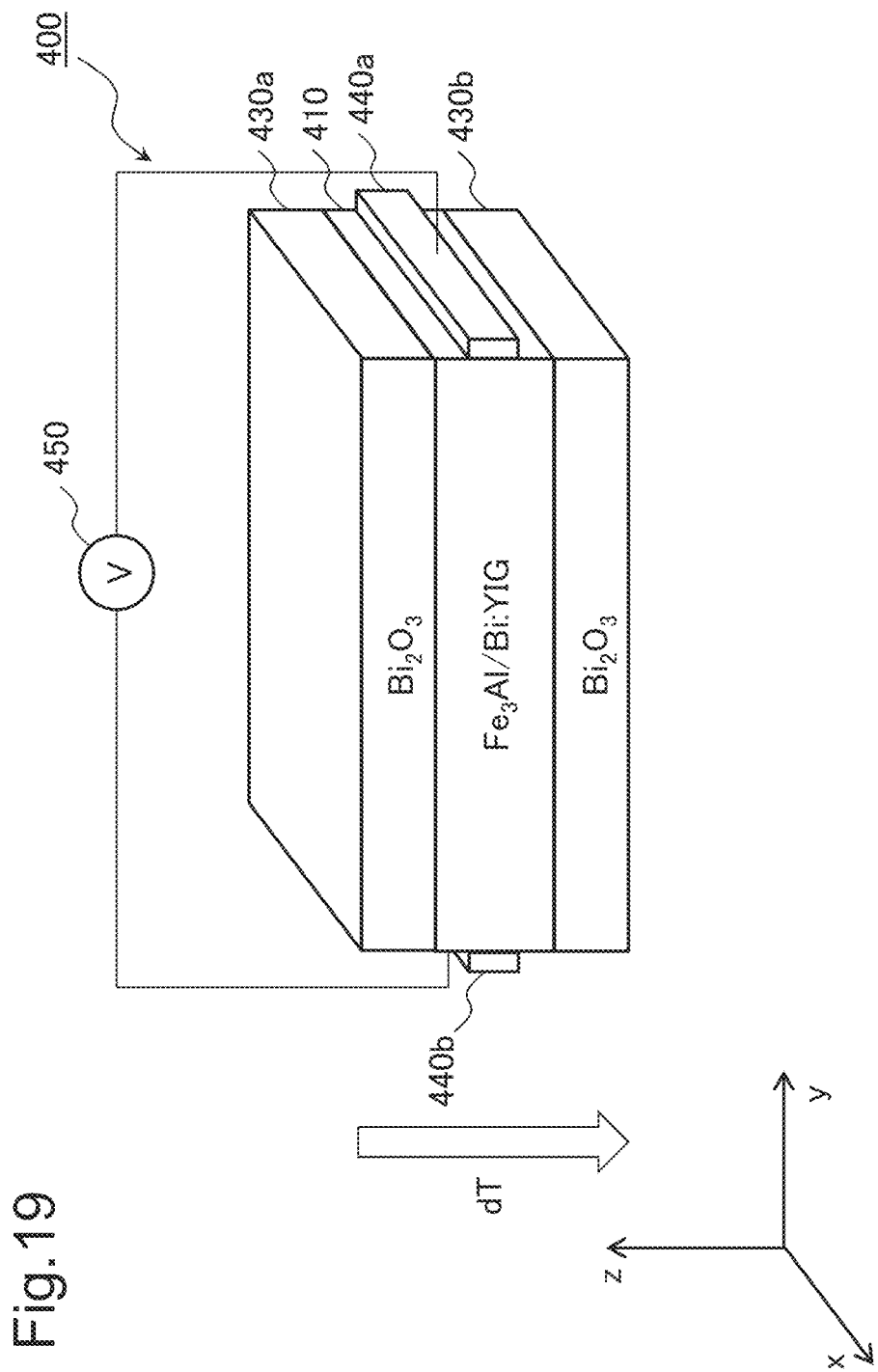
FIG. 19 is a conceptual diagram showing an example of a thermoelectric conversion element according to Example 4 of the present invention.

FIG. 19 is a conceptual diagram of a thermoelectric conversion element 400 of the present example. The thermoelectric conversion element 400 has a structure in which a power generation layer 410 is sandwiched between a first support layer 430a and a second support layer 430b. In FIG. 19, an electrode terminal 440a and an electrode terminal 440b are provided on two end surfaces of the power generation layer 410 facing each other, and a voltmeter 450 for measuring a voltage between the electrode terminal 440a and the electrode terminal 440b is shown.

Figure 20:
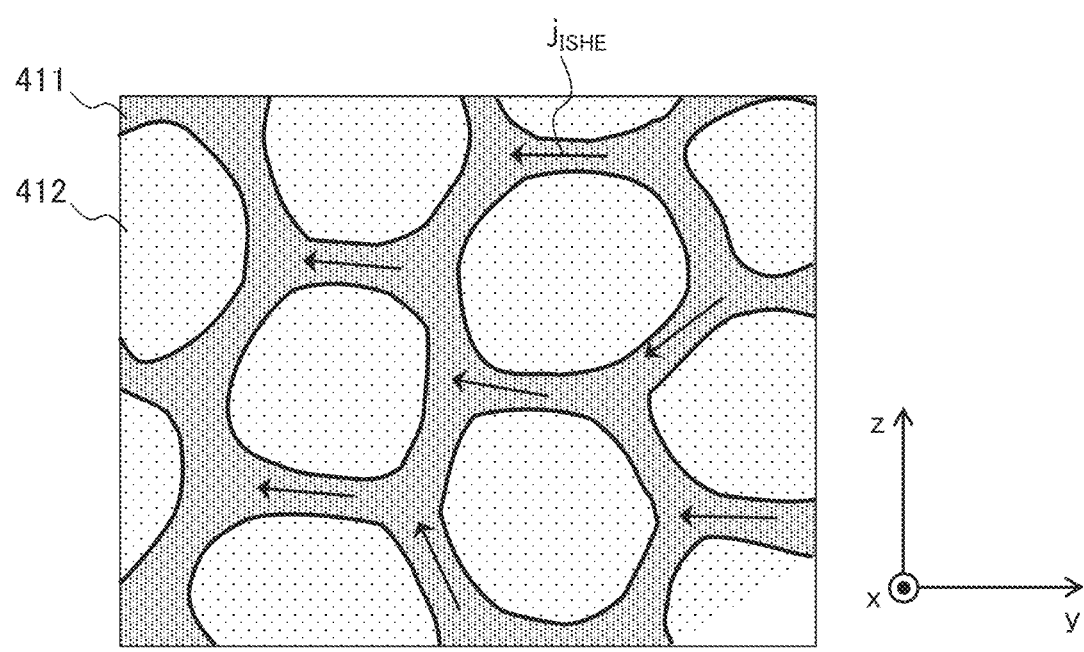
FIG. 20 is a conceptual diagram showing an example of a structure of an iron-aluminum alloy network included in the thermoelectric conversion element according to Example 4 of the present invention.

FIG. 20 is a conceptual diagram showing an example of the structure of the power generation layer 410. FIG. 20 is a diagram of a cross section of the power generation layer 410 cut along the zy-plane viewed from a viewpoint in direction +x. The power generation layer 410 includes a magnetic network 411 and granular magnetic particles 412 dispersed inside the magnetic network 411. In other words, in the power generation layer 410, the granular magnetic particles 412 are arranged in isolation from each other, and the magnetic network 411 spreads in a net-like shape in such a way as to fill the gap between the grains of the magnetic particles 412.

In the present example, first, an Fe₃Al/Bi:YIG powder in which Fe₃Al having a film thickness of 15 nm is formed on a surface of a Bi:YIG powder having an average grain size of 5 μm was prepared. Thereafter, the Fe₃Al/Bi:YIG powder and a Bi₂O₃ powder having an average grain size of 7.5 μm were used to form the thermoelectric conversion element 400. Specifically, the Bi₂O₃ powder, the Fe₃Al/Bi:YIG powder, and the Bi₂O₃ powder were laminated in three layers in order, packed in a mold, press molded at 100 MPa, and then sintered at 600° C. for two hours to form the thermoelectric conversion element 400. In general, sintering of the Fe₃Al/Bi:YIG powder alone normally requires a temperature equal to or more than 800° C., and it is difficult to ensure the strength that can be thermoelectrically evaluated at a temperature equal to or less than this. Since the Fe₃Al/Bi:YIG powder was sandwiched between Bi₂O₃ having a low sintering temperature and sintered in the present example, it was possible to prepare the thermoelectric conversion element 400 having a relatively high strength even at 600° C.

By applying a temperature gradient dT in the out-of-plane direction (direction −z in FIG. 19) of the thermoelectric conversion element 400 prepared by the above procedure, the thermoelectromotive force based on the spin Seebeck effect and the anomalous Nernst effect was measured.

While the present invention has been described with reference to the example embodiments, the invention is not limited to these example embodiments. Various modifications that would be understood by those skilled in the art can be made in the structure and details of the present invention within the scope of the invention.

Some or all of the above example embodiments may be described as in the following supplementary notes, but are not limited to the following.

Supplementary Note 1

A thermoelectric conversion element including
an iron-aluminum alloy exhibiting an anomalous Nernst effect and containing equal to or more than 70 weight percent (wt %) of iron and aluminum in total.

Supplementary Note 2

A thermoelectric conversion element including
a power generation layer containing an iron-aluminum based magnetic alloy material containing equal to or more than 70 wt % of iron and aluminum in total, in which
the power generation layer
generates an electromotive force, due to an anomalous Nernst effect that develops in the magnetic alloy material in response to a temperature gradient applied to the power generation layer, in a direction intersecting both a magnetization direction of the magnetic alloy material and a direction of the applied temperature gradient.

Supplementary Note 3

The thermoelectric conversion element according to Supplementary Note 2, in which
the power generation layer
has a plate-like shape including two main surfaces facing each other, has the magnetic alloy material magnetized in the in-plane direction of the main surface, and in response to a temperature gradient applied in the out-of-plane direction of the main surface, generates an electromotive force in a direction intersecting both the magnetization direction of the magnetic alloy material and the direction of the applied temperature gradient.

Supplementary Note 4

The thermoelectric conversion element according to Supplementary Note 2 or 3, in which
the power generation layer
includes the magnetic alloy material configured of a polycrystalline substance having an average crystal grain size of less than 50 micrometers (μm).

Supplementary Note 5

The thermoelectric conversion element according to any one of Supplementary Notes 2 to 4, in which
a thickness of the power generation layer is equal to or more than 1 μm.

Supplementary Note 6

The thermoelectric conversion element according to any one of Supplementary Notes 2 to 5, in which
the content of aluminum to iron in the magnetic alloy material is in the range of 10 wt % to 17 wt %.

Supplementary Note 7

The thermoelectric conversion element according to any one of Supplementary Notes 2 to 6, in which
the composition ratio of iron to aluminum in the magnetic alloy material is 3:1.

Supplementary Note 8

The thermoelectric conversion element according to any one of Supplementary Notes 2 to 7, in which
the magnetic alloy material contains chromium of equal to or more than 10 wt % and equal to or less than 25 wt %.

Supplementary Note 9

The thermoelectric conversion element according to any one of Supplementary Notes 2 to 8, in which
the power generation layer
has a structure in which a first magnetic layer containing the magnetic alloy material and a second magnetic layer exhibiting a spin Seebeck effect by application of a temperature gradient are laminated.

Supplementary Note 10

The thermoelectric conversion element according to Supplementary Note 9, in which
a thickness of the first magnetic layer is equal to or less than 100 nanometers.

Supplementary Note 11

The thermoelectric conversion element according to any one of Supplementary Notes 2 to 8, in which
the power generation layer
is configured of a magnetic network containing the magnetic alloy material, and magnetic particles dispersed in the magnetic network and exhibiting a spin Seebeck effect by application of a temperature gradient.

Supplementary Note 12

The thermoelectric conversion element according to Supplementary Note 7, in which
the magnetic alloy material is an ordered alloy.

Supplementary Note 13

The thermoelectric conversion element according to Supplementary Note 2 or 3, in which
the power generation layer
includes the magnetic alloy material configured of a polycrystalline substance having an average crystal grain size of less than 10 μm.

This application is based upon and claims the benefit of priority from Japanese patent application No. 2018-238642 filed on Dec. 20, 2018, and Japanese patent application No. 2019-099484 filed on May 28, 2019 based on Japanese patent application No. 2018-238642, the disclosure of which is incorporated herein in its entirety by reference.

REFERENCE SIGNS LIST 1, 2, 3, 4 thermoelectric conversion element
10, 20, 30, 40 power generation layer
14a, 24a, 34a, 44a electrode terminal
14b, 24b, 34b, 44b electrode terminal
15, 25, 35, 45 voltmeter
31 first magnetic layer
32 second magnetic layer 43a first support layer
43b second support layer
100, 200, 300, 400 thermoelectric conversion element
110, 210, 310, 410 power generation layer
140a, 240a, 340a, 440a electrode terminal
140b, 240b, 340b, 440b electrode terminal
150, 250, 350, 450 voltmeter
311 first magnetic layer
312 second magnetic layer
313 SGGG substrate
401, 411 magnetic network
402, 412 magnetic particle
430a first support layer
430b second support layer

The invention claimed is:

1. A thermoelectric conversion element comprising:
a power generation layer comprising an iron-aluminum alloy exhibiting an anomalous Nernst effect and containing equal to or more than 70 weight percent of iron and aluminum in total, wherein
the power generation layer is magnetized in an in-plane direction parallel to a main surface of the power generation layer, and generates an electromotive force, due to an anomalous Nernst effect that develops in the magnetic alloy material in response to a temperature gradient applied to the power generation layer, in a direction intersecting both a magnetization direction of the magnetic alloy material and a direction of the applied temperature gradient,
a thickness of the power generation layer is greater than 10 micrometers in an out-of-plane direction perpendicular to the main surface of the power generation layer, and
the magnetic alloy material contains chromium of equal to or more than 10 weight percent and equal to or less than 25 weight percent.

2. The thermoelectric conversion element according to claim 1, wherein
the power generation layer
has a plate-like shape including two main surfaces facing each other, has the magnetic alloy material magnetized in the in-plane direction of the main surface, and in response to a temperature gradient applied in the out-of-plane direction of the main surface, generates an electromotive force in a direction intersecting both the magnetization direction of the magnetic alloy material and the direction of the applied temperature gradient.

3. The thermoelectric conversion element according to claim 1, wherein
the power generation layer
includes the magnetic alloy material configured of a polycrystalline substance having an average crystal grain size of less than 50 micrometers.

4. The thermoelectric conversion element according to claim 1, wherein
the content of aluminum to iron in the magnetic alloy material is in the range of 10 weight percent to 17 weight percent.

5. The thermoelectric conversion element according to claim 1, wherein
an atomic ratio of iron to aluminum in the magnetic alloy material is 3:1.

6. The thermoelectric conversion element according to claim 5, wherein
the magnetic alloy material is an ordered alloy.

7. The thermoelectric conversion element according to claim 1, wherein
the power generation layer
has a structure in which a first magnetic layer containing the magnetic alloy material and a second magnetic layer exhibiting a spin Seebeck effect by applying a temperature gradient are laminated.

8. The thermoelectric conversion element according to claim 7, wherein
a thickness of the first magnetic layer is equal to or less than 100 nanometers.

9. The thermoelectric conversion element according to claim 1, wherein
the power generation layer
is configured of a magnetic network containing the magnetic alloy material, and magnetic particles dispersed in the magnetic network and exhibiting a spin Seebeck effect by applying a temperature gradient.

10. The thermoelectric conversion element according to claim 1, wherein
the power generation layer
includes the magnetic alloy material configured of a polycrystalline substance having an average crystal grain size of less than 10 micrometers.

* * * * *